(12) United States Patent
Kim et al.

(10) Patent No.: US 10,535,605 B2
(45) Date of Patent: Jan. 14, 2020

(54) SEMICONDUCTOR MEMORY DEVICE

(71) Applicant: Samsung Electronics Co., Ltd., Suwon-si, Gyeonggi-do (KR)

(72) Inventors: Eunjung Kim, Daegu (KR); Hui-Jung Kim, Seongnam-si (KR); Keunnam Kim, Yongin-si (KR); Daeik Kim, Hwaseong-si (KR); Bong-soo Kim, Yongin-si (KR); Yoosang Hwang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 142 days.

(21) Appl. No.: 15/782,556

(22) Filed: Oct. 12, 2017

(65) Prior Publication Data

US 2018/0040561 A1 Feb. 8, 2018

Related U.S. Application Data

(63) Continuation of application No. 15/592,860, filed on May 11, 2017.

(30) Foreign Application Priority Data

Aug. 8, 2016 (KR) .................. 10-2016-0100899
Oct. 19, 2016 (KR) .................. 10-2016-0136009

(51) Int. Cl.
| | |
|---|---|
| *H01L 23/532* | (2006.01) |
| *H01L 21/764* | (2006.01) |
| *H01L 23/522* | (2006.01) |
| *H01L 23/528* | (2006.01) |
| *H01L 27/108* | (2006.01) |
| *H01L 27/24* | (2006.01) |

(52) U.S. Cl.
CPC ........ *H01L 23/5329* (2013.01); *H01L 21/764* (2013.01); *H01L 23/5226* (2013.01); *H01L 23/5283* (2013.01); *H01L 27/10814* (2013.01); *H01L 27/2436* (2013.01); *H01L 27/2463* (2013.01)

(58) Field of Classification Search
None
See application file for complete search history.

(56) References Cited

U.S. PATENT DOCUMENTS

| | | | |
|---|---|---|---|
| 7,749,834 B2 | 7/2010 | Park et al. | |
| 8,921,223 B2 | 12/2014 | Lee | |
| 9,012,321 B1 | 4/2015 | Kim et al. | |

(Continued)

FOREIGN PATENT DOCUMENTS

| | | |
|---|---|---|
| KR | 20140082281 A | 7/2014 |
| KR | 20160012826 A | 2/2016 |

*Primary Examiner* — Steven B Gauthier
(74) *Attorney, Agent, or Firm* — Myers Bigel, P.A.

(57) ABSTRACT

A semiconductor memory device includes word lines extending in a first direction on a semiconductor substrate, bit line structures crossing over the word lines and extending in a second direction intersecting the first direction, and contact pad structures between the word lines and between the bit line structures in plan view. A spacer structure extends between the bit line structures and the contact pad structures. The spacer structure includes a first air gap extending in the second direction along sidewalls of the bit line structures and a second air gap surrounding each of the contact pad structures and coupled to the first air gap.

18 Claims, 41 Drawing Sheets

(56) References Cited

U.S. PATENT DOCUMENTS

2013/0292847 A1* 11/2013 Choi .................. H01L 23/498
　　　　　　　　　　　　　　　　　　　　　257/774
2015/0214146 A1　　7/2015　Kim et al.
2015/0262625 A1　　9/2015　Han et al.
2016/0027727 A1　　1/2016　Kim et al.

* cited by examiner

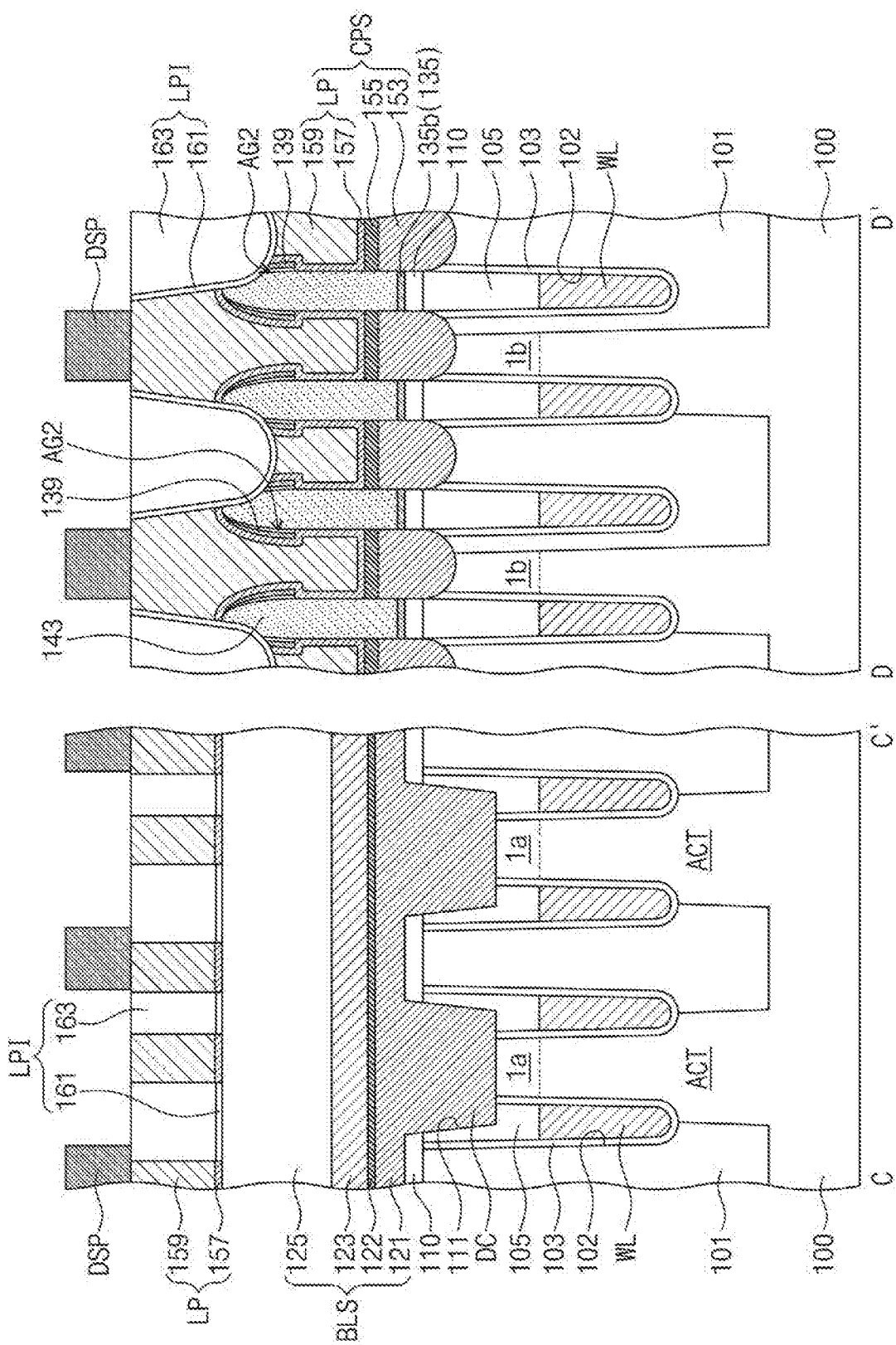

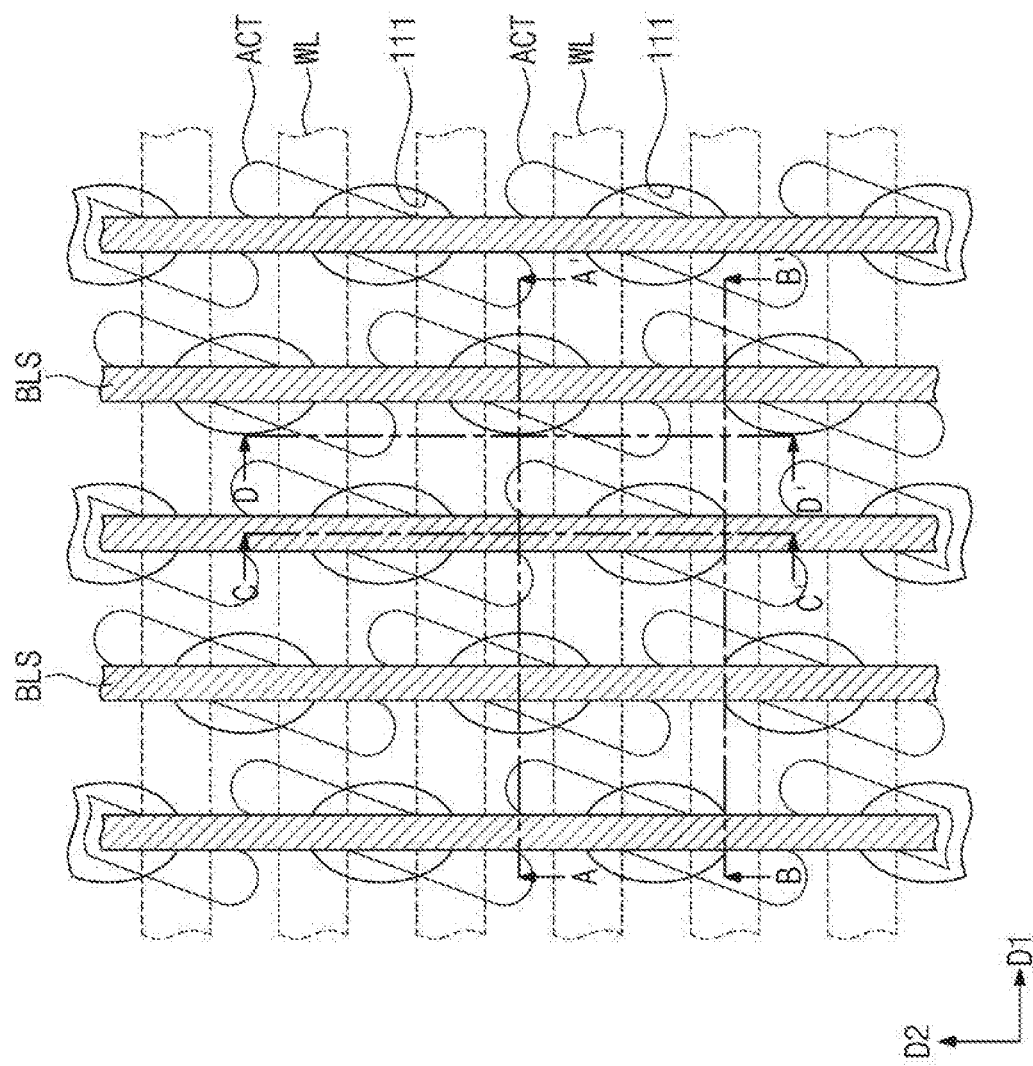

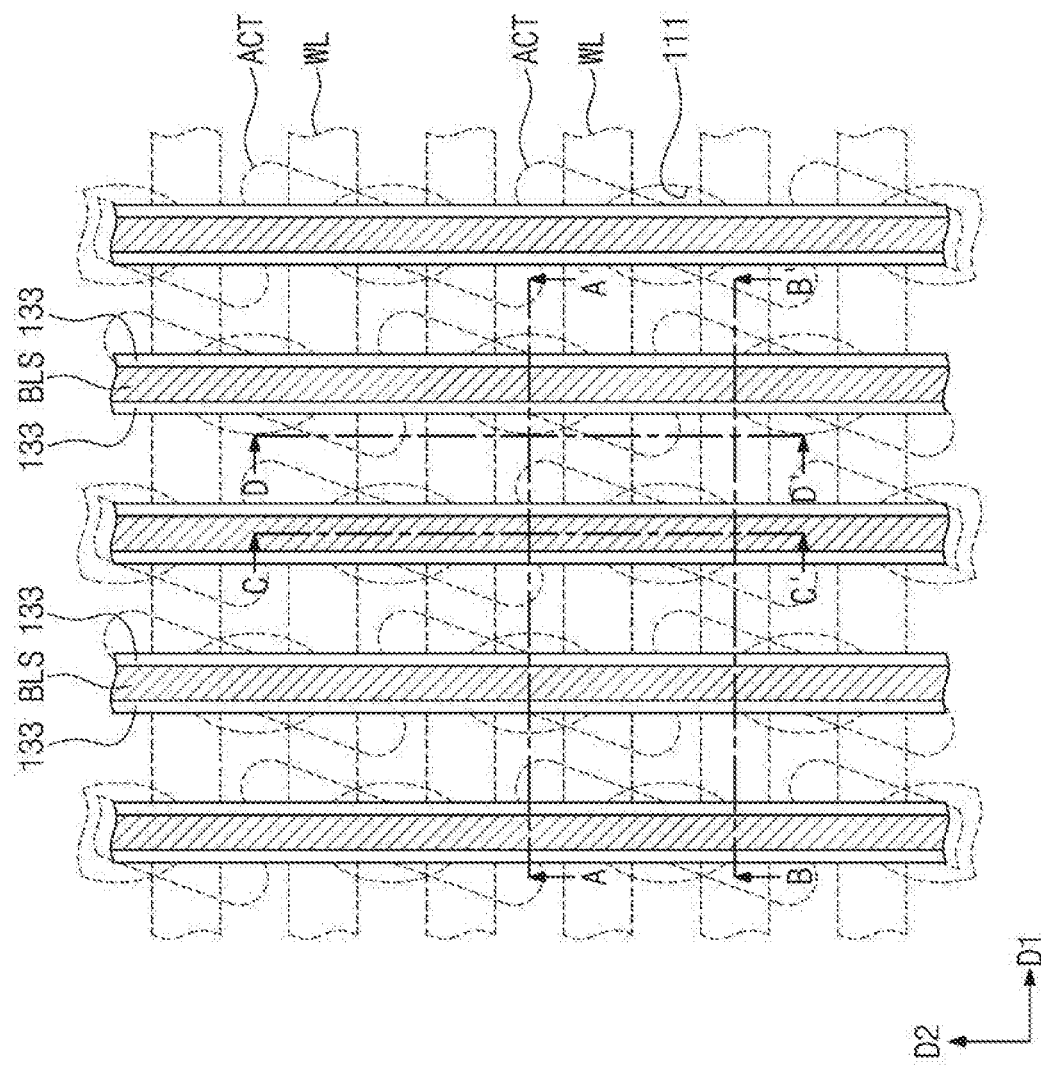

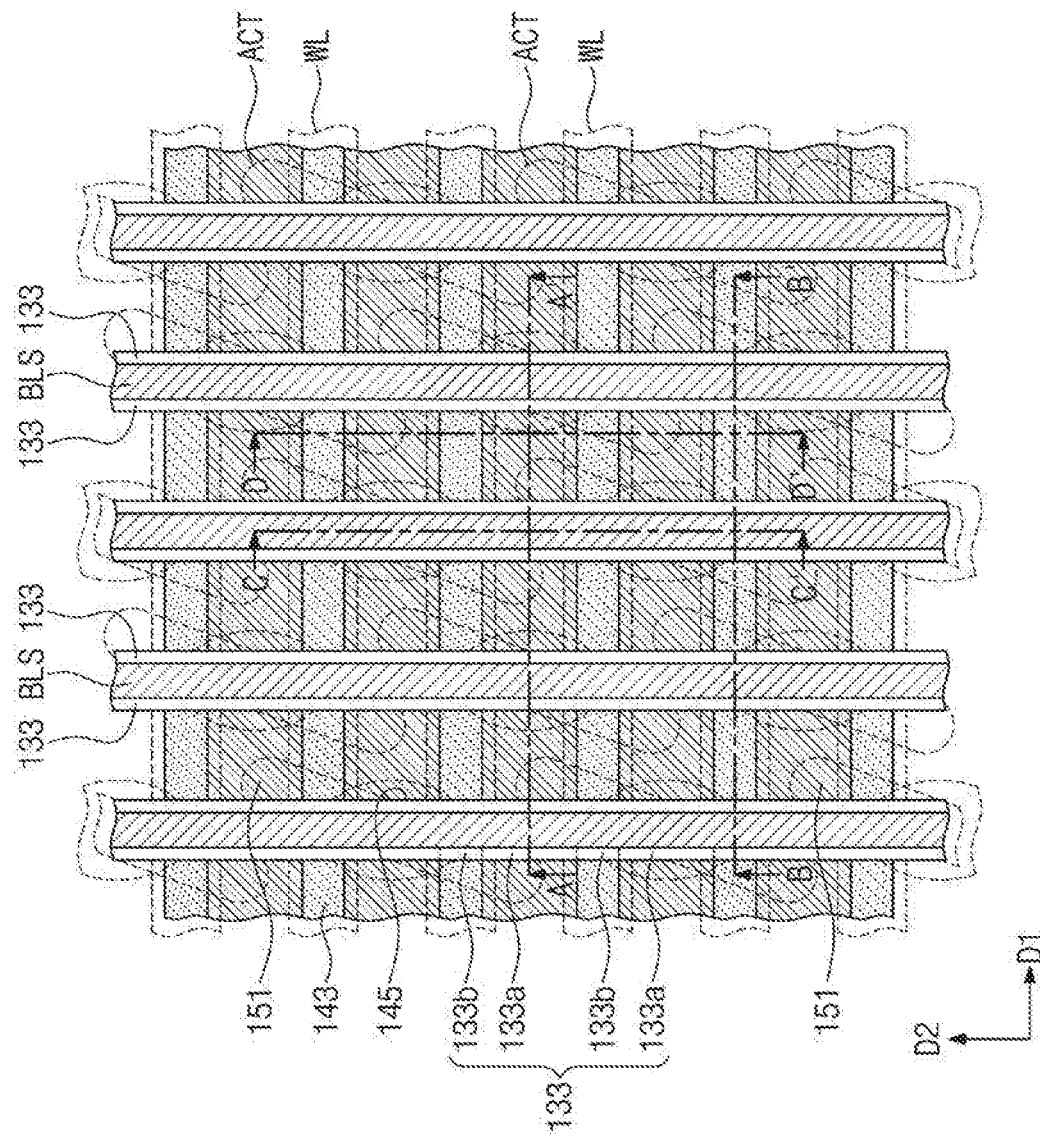

SEMICONDUCTOR MEMORY DEVICE

CLAIM OF PRIORITY

The present application is a continuation of and claims priority to U.S. application Ser. No. 15/592,860, filed May 11, 2017, which claims priority under 35 U.S.C. § 119 to Korean Patent Application No. 10-2016-0100899, filed on Aug. 8, 2016 and Korean Patent Application No. 10-2016-0136009, filed on Oct. 19, 2016 in the Korean Intellectual Property Office, the disclosures of which are hereby incorporated by reference in their entirety.

BACKGROUND

Embodiments of the present disclosure relate to semiconductor memory devices, and more specifically, to semiconductor memory devices including air gap-based spacer structures.

Semiconductor devices may be used in the electronics industry because of their small size, multi-function, and/or lower manufacturing costs. Semiconductor devices can be classified into semiconductor memory devices storing logic data, semiconductor logic devices processing operations of logic data, and hybrid devices having functions of both memory devices and logic devices.

Some semiconductor devices may include vertically stacked patterns and contact plugs electrically connecting the stack patterns to each other. As semiconductor devices have been highly integrated, a distance between the patterns and/or a distance between the patterns and the contact plugs have been reduced. Thus, a parasitic capacitance between the patterns and/or between the patterns and the contact plugs can increase. The parasitic capacitance can cause performance deterioration (e.g., reduction of an operating speed) of semiconductor devices.

SUMMARY

Example embodiments of the inventive concepts may provide semiconductor devices with improved electrical characteristics.

According to an example embodiment of the inventive concepts, a semiconductor memory device may include word lines extending in a first direction on a semiconductor substrate, bit line structures crossing over the word lines and extending in a second direction intersecting the first direction, contact pad structures between the word lines and between the bit line structures, in plan view, and a spacer structure between the bit line structures and the contact pad structures. The spacer structure may include a first air gap extending in the second direction along sidewalls of the bit line structures and a second air gap surrounding each of the contact pad structures and coupled to the first air gap.

According to an example embodiment of the inventive concepts, a semiconductor memory device may include word lines extending in a first direction in a semiconductor substrate, bit line structures crossing over the word lines and extending in a second direction intersecting the first direction, contact pad structures between the bit line structures and between the word lines, in plan view, insulating patterns on the word lines and, in plan view, between the contact pad structures and between the bit line structures, and a spacer structure between the bit line structures and the contact pad structures. The spacer structure may include a first spacer and a second spacer extending from between the bit line structures and the contact pad structures to between the bit line structures and the insulating patterns, a first air gap between the first spacer and the second spacer and extending in the second direction, and a second air gap extending from the first air gap to between the insulating patterns and the contact pad structures along the first direction.

According to an example embodiment of the inventive concepts, a semiconductor memory device may include a first bit line structure and a second bit line structure extending in a first direction on a semiconductor substrate, wherein the first bit line structure has a first sidewall and a second bit line structure has a sidewall opposite to the first sidewall, contact pad structures arranged to be spaced apart from each other in the first direction, between the first and second bit line structures, a first spacer structure comprising a first air gap extending along the first sidewall of the first bit line structure, a second spacer structure comprising a second air gap extending along the second sidewall of the second bit line structure, and a third spacer structure including a third air gap surrounding the contact pad structures and coupling the first air gap to the second air gap.

According to some example embodiments of the inventive concepts, a semiconductor memory device may include word lines and adjacent bit line structures extending in first and second intersecting directions, respectively, on a substrate. Contact pad structures including respective conductive landing pads may be provided between respective sidewalls of the adjacent bit line structures, and may contact impurity regions of the substrate. First air gaps may extend along the respective sidewalls of the adjacent bitline structures in the second direction and may separate the respective conductive landing pads therefrom, and second air gaps may extend from at least one of the first air gaps and along multiple sides of the respective conductive landing pads in the first direction.

BRIEF DESCRIPTION OF THE DRAWINGS

FIG. 1C illustrates a cross-sectional view taken along lines C-C' and D-D' of FIG. 1A.

FIGS. 4A, 5A, 6A, 7A, 8A, 9A, 10A, 11A, 12A, 13A and 14A are plan views illustrating a method of manufacturing a semiconductor memory device according to example embodiments.

DETAILED DESCRIPTION OF THE EMBODIMENTS

Figure 1A:
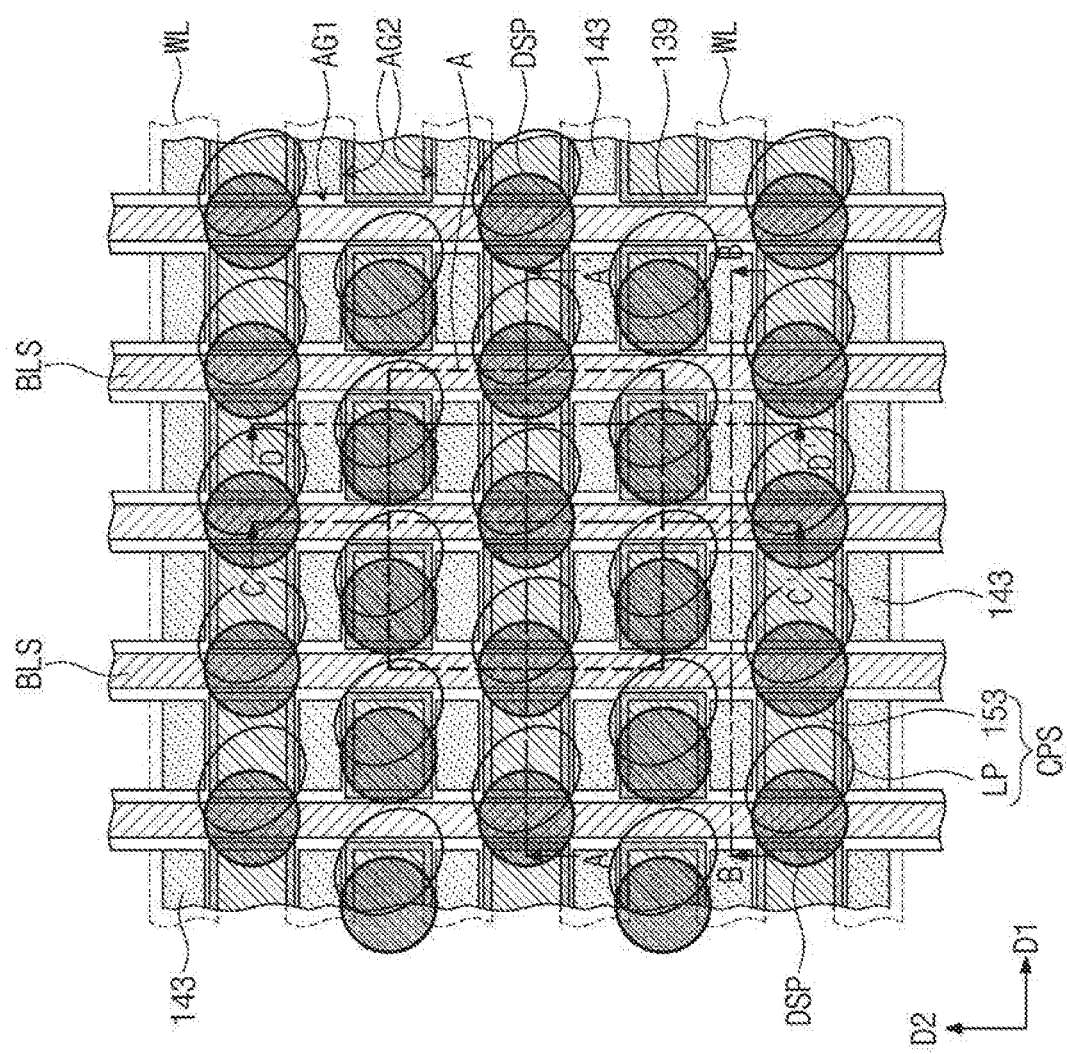
FIG. 1A is a plan view illustrating a semiconductor memory device according to example embodiments.
Figure 1B:
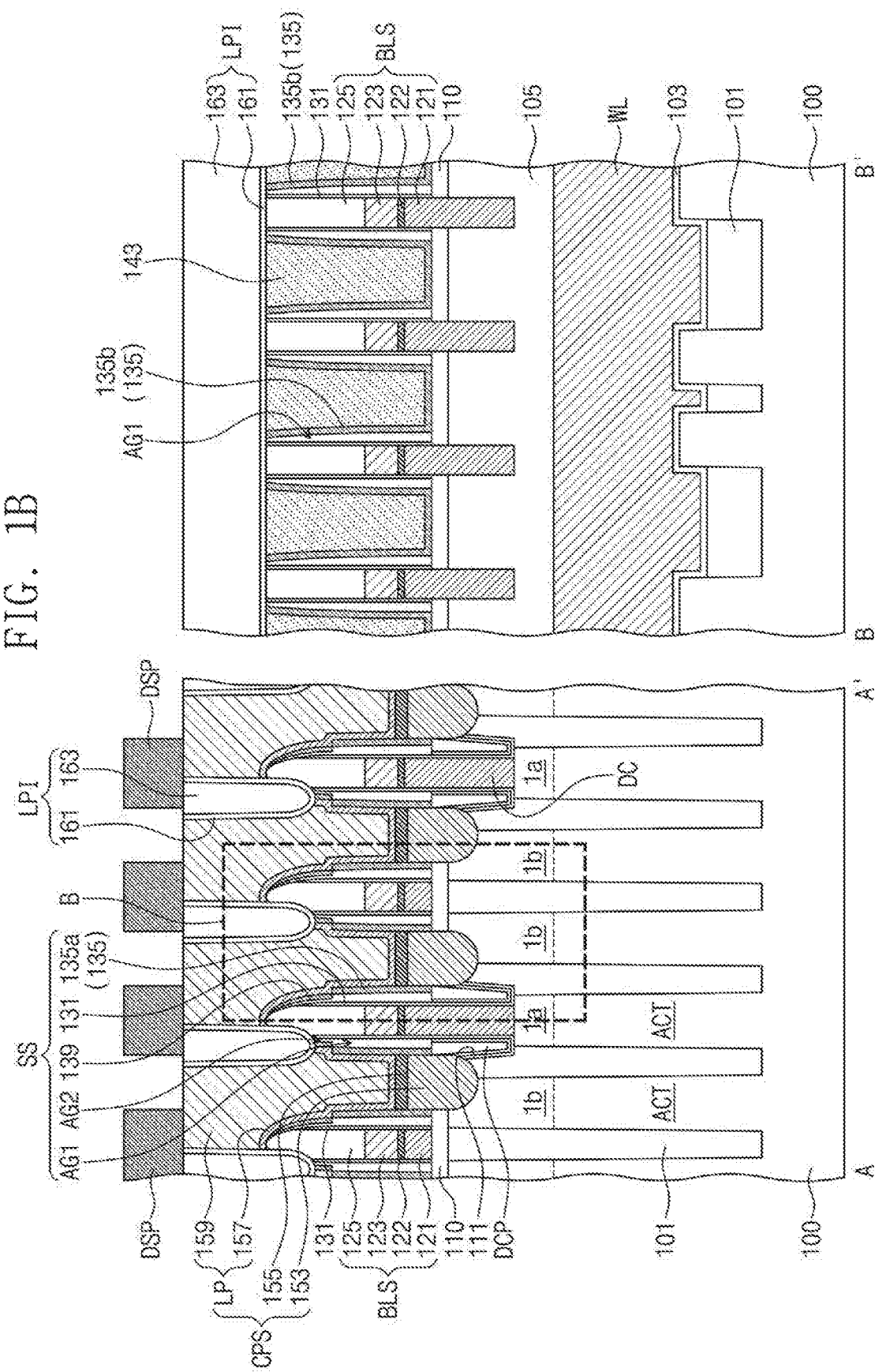
FIG. 1B illustrates a cross-sectional view taken along lines A-A' and B-B' of FIG. 1A.
Figure 2A:
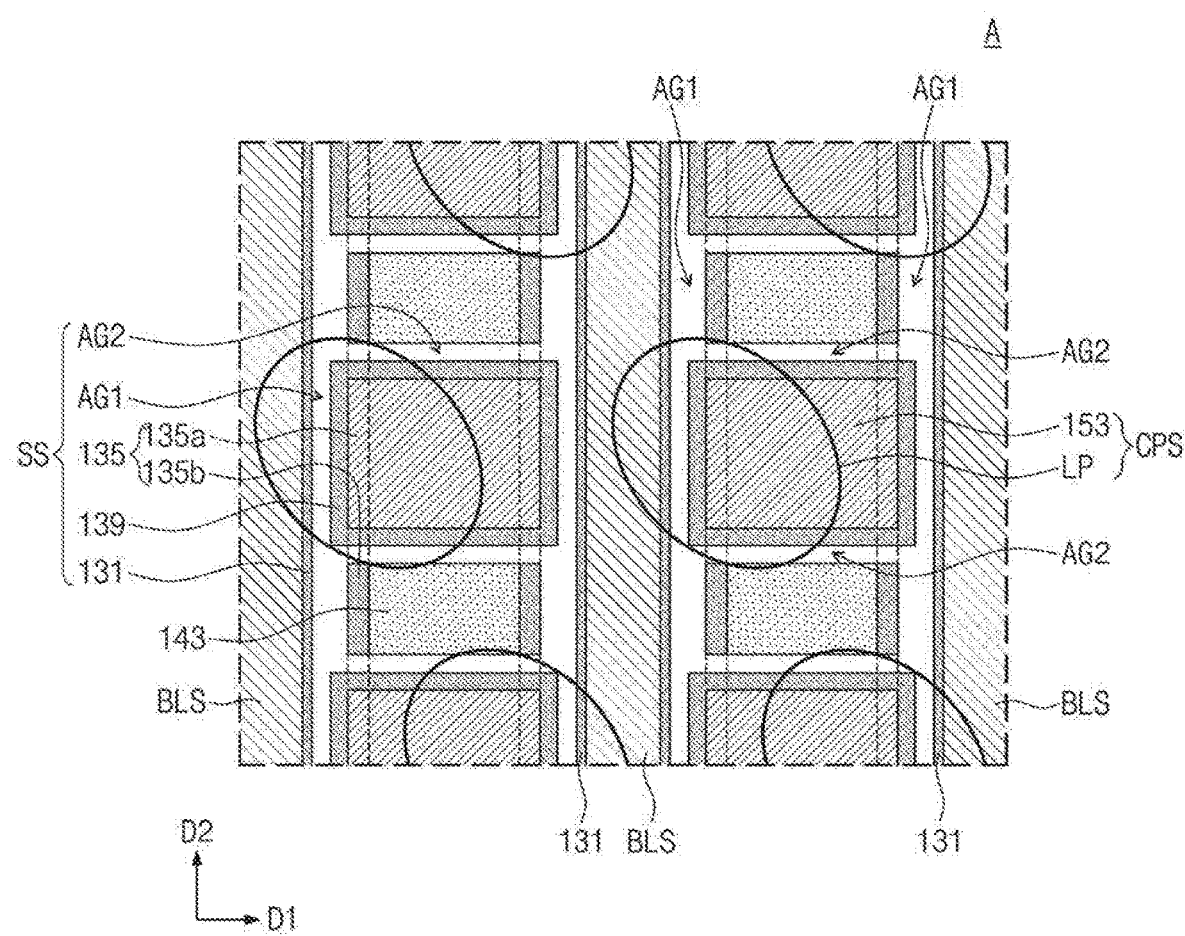
FIG. 2A is an enlarged view illustrating portion A of FIG. 1A.
Figure 2B:
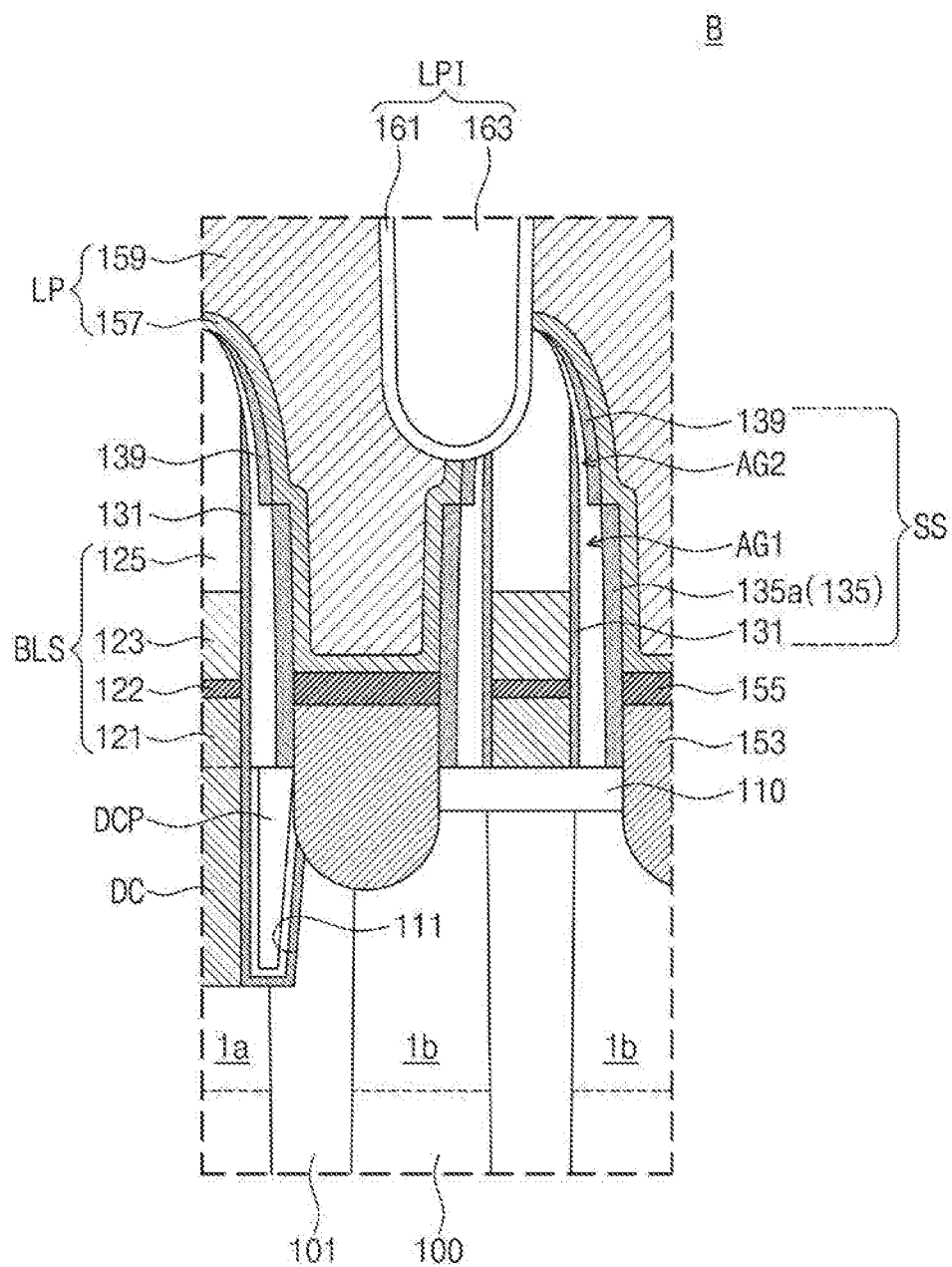
FIG. 2B is an enlarged view illustrating portion B of FIG. 1B.
Figure 2C:
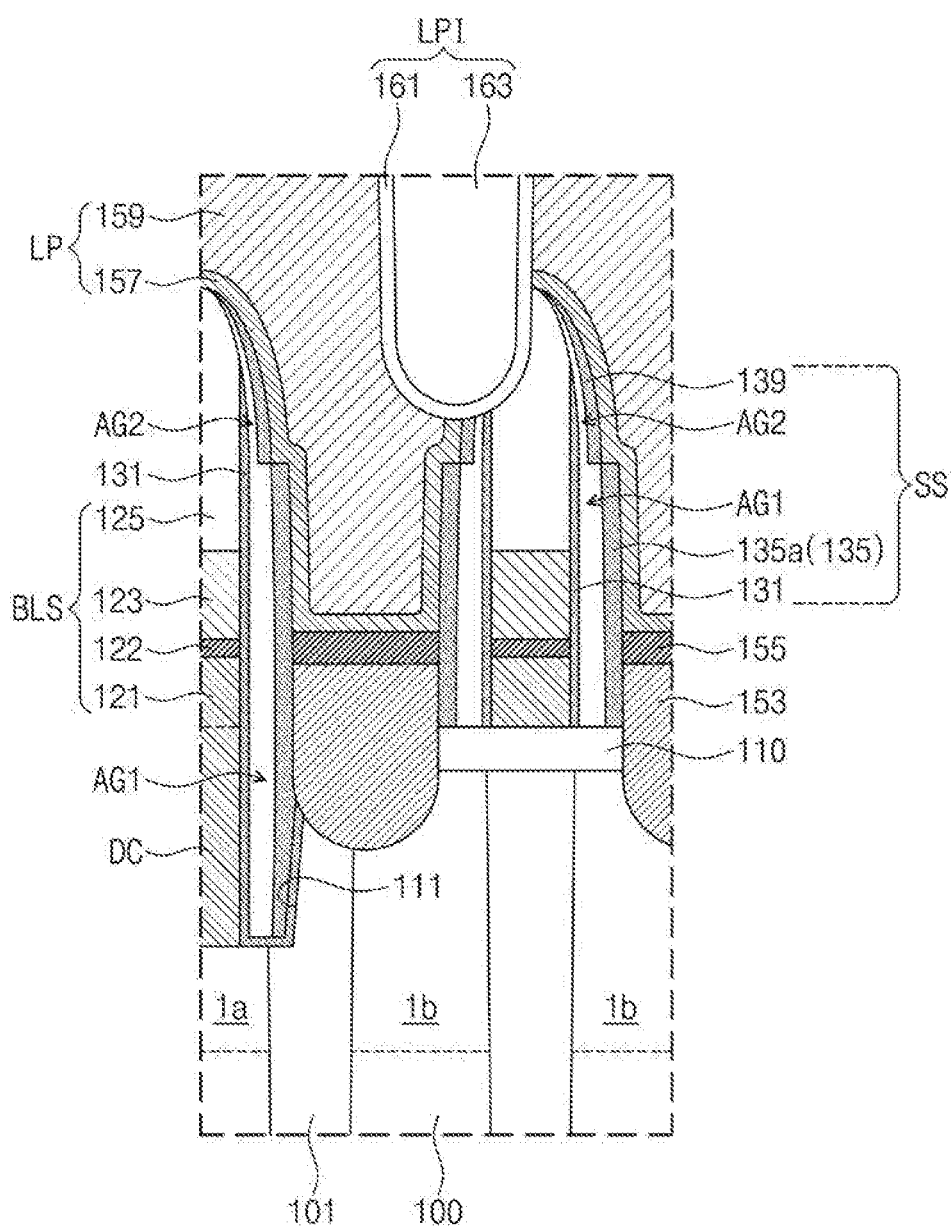
FIG. 2C illustrates a semiconductor memory device according to other example embodiments and is an enlarged view illustrating portion B of FIG. 1B.
Figure 3A:
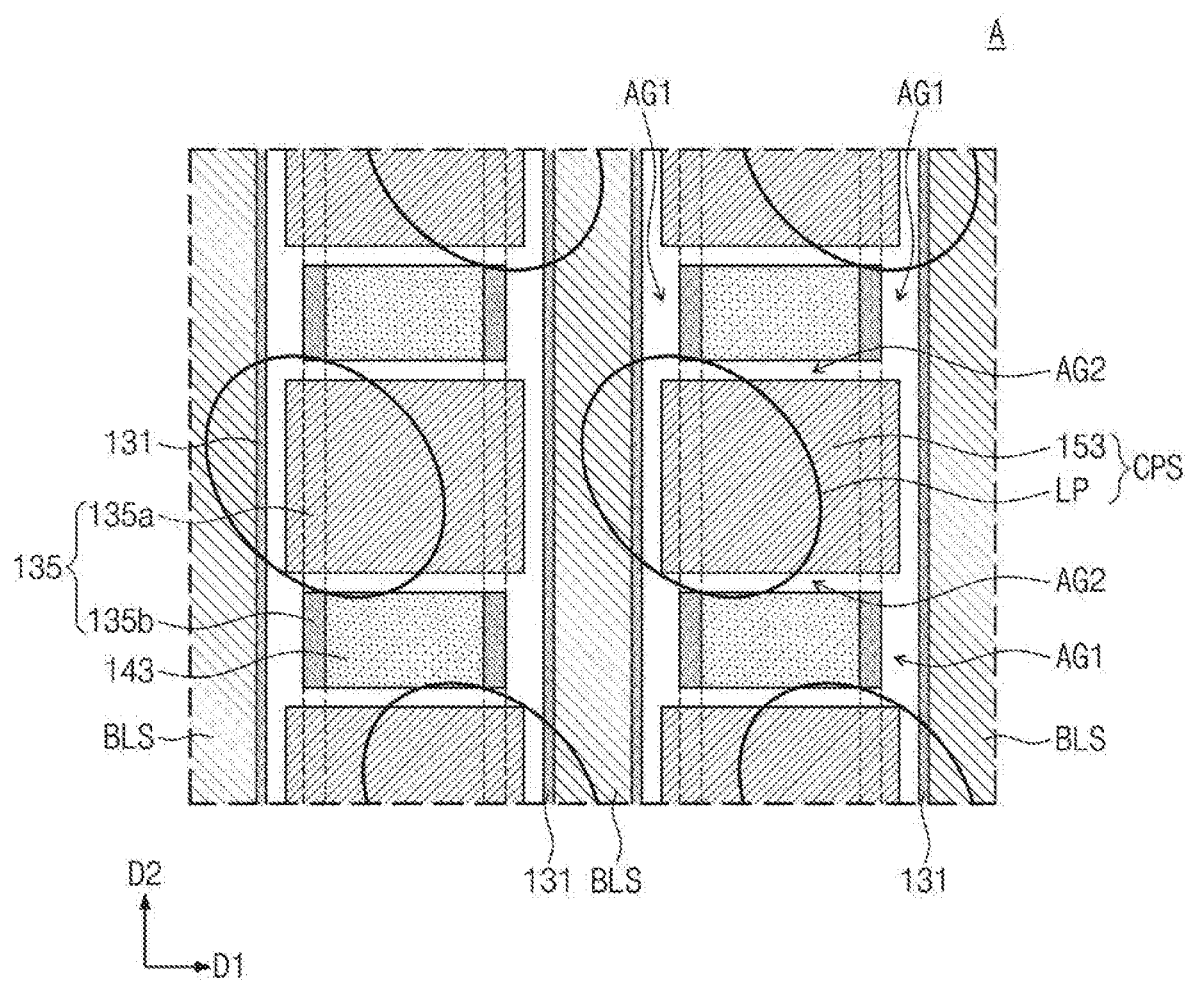
FIGS. 3A and 3B illustrate a semiconductor memory device according to still other example embodiments and are enlarged views illustrating portion A of FIG. 1A and portion B of FIG. 1B, respectively.
Figure 3B:
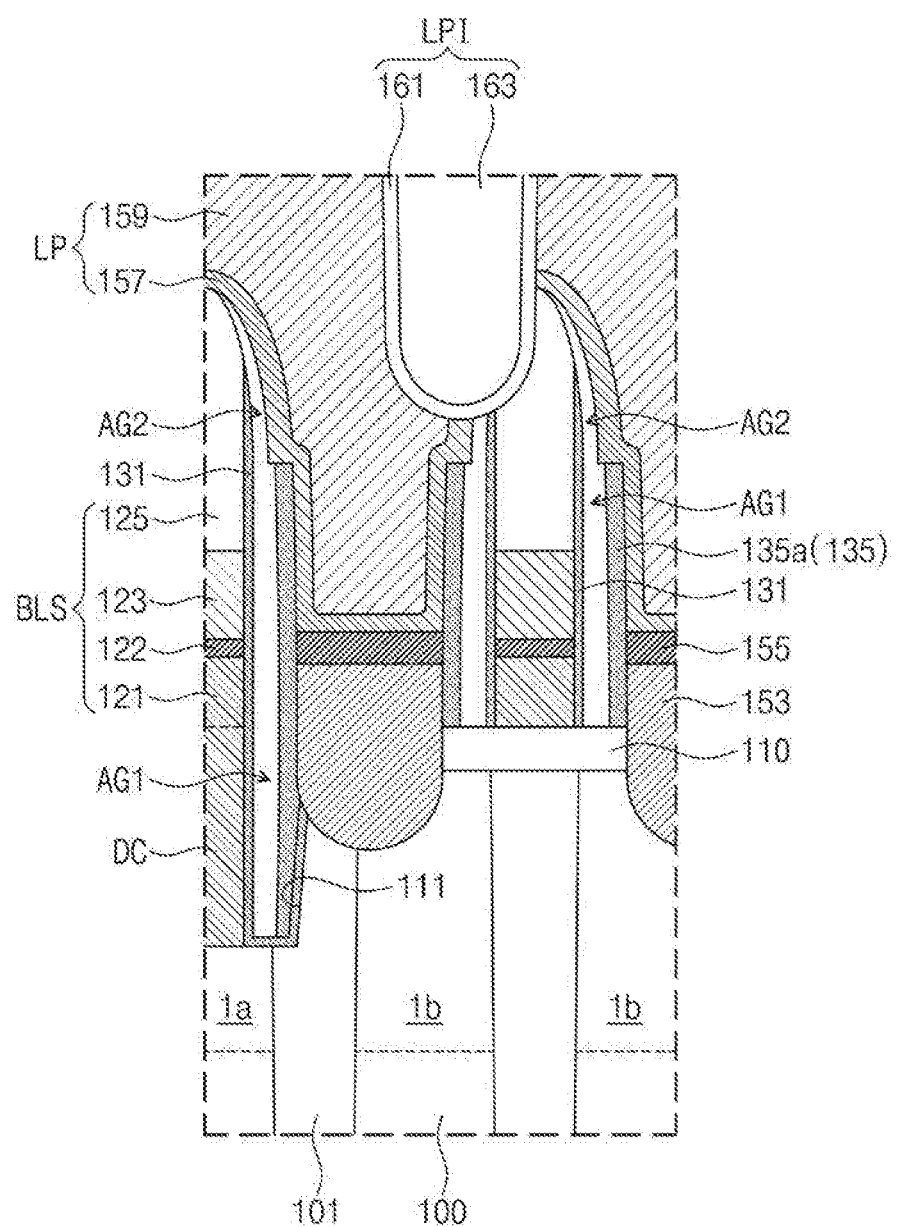

The inventive concepts will now be described more fully hereinafter with reference to the accompanying drawings, in which example embodiments of the inventive concepts are shown. This inventive concepts may, however, be embodied in different forms and should not be construed as limited to the embodiments set forth herein FIG. 1A is a plan view illustrating a semiconductor memory device according to example embodiments, FIG. 1B illustrates a cross-sectional view taken along lines A-A' and B-B' of FIG. 1A and FIG. 1C illustrates a cross-sectional view taken along lines C-C' and D-D' of FIG. 1A. FIG. 2A is an enlarged view illustrating portion A of FIG. 1A, and FIG. 2B is an enlarged view illustration portion B of FIG. 1B. FIG. 2C illustrates a semiconductor memory device according to other example embodiments and is an enlarged view illustrating portion B of FIG. 1B. FIGS. 3A and 3B illustrate a semiconductor memory device according to still other example embodiments and are enlarged views illustrating portion A of FIG. 1A and portion B of FIG. 1B, respectively.

FIGS. 1A, 1B and 1C, a device isolation layer 101 defining active regions ACT may be disposed in a semiconductor substrate 100. The semiconductor substrate 100 may include a silicon substrate, a germanium substrate and/or a silicon-germanium substrate.

In an example, the active regions ACT may have a bar shape and may be two-dimensionally arranged along a first direction D1 and a second direction D2 intersecting or crossing (e.g., perpendicular to) the first direction D1. The active regions ACT may be arranged in a zigzag form in plan view and may have a major axis oblique to the first direction D1 and the second direction D2.

Word lines WL may be disposed in the semiconductor substrate 100 and may extend in the first direction D1 in plan view to intersect the active regions ACT and the device isolation layer 101.

A gate insulating layer 103 may be interposed between the word lines WL and the semiconductor substrate 100. Top surfaces of the word lines WL may be positioned or extend lower than a top surface of the semiconductor substrate 100. A gate hard mask pattern 105 may be disposed on each of the word lines WL.

A first impurity region 1a and a second impurity region 1b may be disposed on each of the active regions ACT at opposite sides of the word lines WL. Bottom surfaces of the first and second impurity regions 1a and 1b may be positioned at a predetermined depth from top surfaces of the active regions ACT. The first impurity region 1a may be disposed in each of the active regions ACT between the word lines WL. The second impurity region 1b may be spaced apart from the first impurity region 1a to be disposed at end portions of each of the active regions ACT. The first and second impurity regions 1a and 1b may include dopants of a conductive type opposite to that of the semiconductor substrate 100.

According to example embodiments, bit line structures BLS may extend in the second direction D2 to intersect the word lines WL. The bit line structures BLS may each overlap a plurality of the first impurity regions 1a. In an example, the bit line structures BLS may each include a polysilicon pattern 121, a silicide pattern 122, a metal pattern 123 and a hard mask pattern 125. An insulating interlayer 110 may be interposed between the semiconductor substrate 100 and the polysilicon pattern 121. A portion of the polysilicon pattern 121 (i.e., a bit line contact pattern DC) may contact the first impurity regions 1a. A bottom surface of the bit line contact pattern DC may be positioned lower than the top surface of the semiconductor substrate 100 and higher than the top surfaces of the word lines WL.

In an example, the bit line contact pattern DC may be locally disposed in a recess region 111 formed in the semiconductor substrate 100 to expose the first impurity region 1a. The recess region 111 may have an elliptical shape, and a minimum width of the recess region 111 may be greater than a width of each bit line structure BLS.

A bit line contact spacer DCP may fill the recess region 111 in which the bit line contact DC is formed. In some embodiments, the bit contact spacer DCP may extend on or cover opposite sidewalls of the bit line contact pattern DC. In other embodiments, the bit line contact spacer DCP may surround the bit line contact pattern DC in the recess region 111. The bit line contact spacer DCP may be formed of an insulating material having an etch selectivity with respect to the insulating interlayer 110. For example, the bit line contact spacer DCP may include a silicon oxide layer, a silicon nitride layer and/or a silicon oxynitride layer and may be formed of multiple layers. In an example, a top surface of the bit line contact spacer DCP may be positioned at the same level as a top surface of the insulating interlayer 110.

According to example embodiments, insulating patterns 143 may disposed on the insulating interlayer 110 and may be arranged in the second direction D2 between the bit line structures BLS. The insulating patterns 143 may overlap with the word lines in plan view and may have top surfaces at the same level as the top surfaces of the bit line structures BLS. The insulating patterns 143 may be formed of insulating material having an etch selectivity with respect to the insulating interlayer 110.

According to example embodiments, contact pad structures CPS may be disposed between the bit line structures BLS to respectively contact the second impurity regions 1b. The contact pad structures CPS may each be disposed between the word lines WL and between the bit line structures BLS in plan view. The contact pad structures CPS may each fill a space defined (or delimited) by the adjacent bit line structures BLS in the first direction D1 and the adjacent insulting patterns 143 in the second direction D2.

Top surfaces of the contact pad structures CPS may be positioned higher than the top surfaces of the bit line structures BLS. A portion of each of the contact pad structures CPS may overlap with each of the bit line structures BLS in plan view. In an example, an upper width of each contact pad structure CPS may be greater than either a distance between the adjacent bit line structures or a width of each bit line structure BLS.

According to example embodiments, the contact pad structures CPS may each include a contact conductive pad 153 contacting each second impurity region 1b, a contact silicide pattern 155 and a landing pad LP.

The contact conductive pad 153 may be formed of, for example, a doped polysilicon layer and may penetrate the insulating interlayer 110 to directly contact each second impurity region 1b. In an example, the contact conductive pad 153 may be positioned lower than the top surface of the semiconductor substrate 100 and higher than the bottom surface of the bit line contact pad DC. Furthermore, the contact conductive pad 153 may be isolated from the bit line contact pattern DC by the bit line contact spacer DCP. A top surface of the contact conductive pad 153 may be positioned lower than a top surface of the metal pattern 123 of each of the bit line structures BLS.

The contact silicide pattern 155 may extend on or cover the top surface of the contact conductive pad 153 and may include, for example, titanium silicide, cobalt silicide, nickel silicide, tungsten silicide, platinum silicide and/or molybdenum silicide. In some embodiments, the contact silicide pattern 155 may be omitted.

A top surface of the landing pad LP may be positioned higher than the top surfaces of the bit line structures BLS, and a bottom surface of the landing pad LP may be positioned lower than the top surfaces of the bit line structures BLS. In an example, the bottom surface of the landing pad LP may be positioned lower than the top surface of the metal pattern 123 of each of the bit line structures BLS.

The landing pad LP may be electrically connected to each of the second impurity regions 1b via the contact silicide pattern 155 and the contact conductive pattern 153. The landing pad LP may include a metal barrier pattern 157 and a pad metal pattern 159 which are sequentially stacked.

According to example embodiments, the landing pad LP may include a lower portion filling between the adjacent bit line structures BLS and between the adjacent insulating patterns 143 and an upper portion extending on a portion of each of the bit line structures BLS. For example, the upper portion of the landing pad LP may partially overlap a portion of each of the bit line structures BLS. An upper width of the landing pad LP may be greater than either a distance between the adjacent bit line structures BLS or a width of each bit line structure BLS. Since the upper portion of the landing pad LP extends on the respective bit line structures BLS, an available surface area of the landing pad LP (e.g., to provide contact with data storage patterns DSP) may be increased. In some embodiments, the actual contact area between the landing pads LP and the data storage patterns DSP may be smaller than the available surface area.

In some embodiments, the upper portion of landing pad LP may have an elliptical shape having a major axis and a minor axis in plan view. The upper portion of the landing pad LP may have the major axis oblique to both the first direction D1 and the second direction D2. In some embodiments, the upper portion of landing pad LP may have a rounded rhombus shape, a rounded rectangular shape or a rounded trapezoidal shape.

According to example embodiments, a spacer structure SS may be disposed between the bit line structures BLS and the contact pad structures CPS. The spacer structure SS may include a first air gap AG1 extending in the second direction D2 along a sidewall of each of the bit line structures BLS and a second air gap AG2 surrounding a portion of each of the contact pad structures CPS and having a ring shape in plan view. The first air gap AG1 may be coupled to the second air gap AG2 and may be under the second air gap AG2.

As an example, the spacer structure SS may further include first and second spacers 131 and 135 defining the first air gap AG1 and a third spacer 139 defining the second air gap AG2 and surrounding a portion of each of the contact pad structures CPS between the bit line structures BLS.

More specifically, referring to FIGS. 2A and 2B, the first and second spacers 131 and 135 may extend, on the insulating interlayer 110, in the second direction D2 along opposite sidewalls of the bit line structures BLS. The first and second spacers 131 and 135 may extend in the second direction D2 from between the bit line structures BLS and the contact pad structures CPS to between the bit line structures BLS and the insulating patterns 143. The first and second spacers 131 and 135 may include an insulating material having an etch selectivity with respect to the insulating interlayer 110.

The first spacer 131 may contact the sidewalls of the bit line structures BLS. The second spacer 135 may be spaced apart from the first spacer 131 such that the first air gap AG1 may be defined as a gap between the first spacer 131 and the second spacer 135. In an example, the first spacer 131 may extend on the sidewalls of the bit line contact pattern DC, and the second spacer 135 may be disposed on the top surface of the bit line contact spacer DCP and on the insulating interlayer 110.

According to example embodiments, the second spacer 135 may include first portions 135a adjacent to the contact pad structures CPS and second portions 135b adjacent to the insulating patterns 143. A height of the first portions 135a may be smaller than a height of the second portions 135b. For example, top surfaces of the first portions 135a may be positioned lower than top surfaces of the second portions 135b. The top surfaces of the first portions 135a may be positioned higher than the top surface of the contact conductive pattern 153.

The third spacer 139 may surround, on the first portions 135a of the second spacer 135, the lower portion of the landing pad LP. The third spacer 139 may have a ring shape in plan view. A portion of the third spacer 139 may be positioned below the upper portion of the landing pad LP. For example, the portion of the third spacer 139 may overlap with the upper portion of the landing pad LP in plan view.

More specifically, the third spacer 139 having the ring shape in plan view may include a first portion below the landing pad LP and a second portion between adjacent landing pads LP. A height of the second portion of the third spacer 139 may be smaller than a height of the first portion of the third spacer 139.

In an example, a portion of the first air gap AG1 and a portion of the second air gap AG2 may overlap with the landing pad LP in plan view.

In some embodiments, the second air gap AG2 may be defined as a gap between the first spacer 131 and the third spacer 139 and between the insulating patterns 143 and the third spacer 139. The second air gap AG2 may be further defined by a gap between the second spacer 135 and the third spacer 139. In other embodiments, the second air gap AG2 may be defined as a gap between the first spacer 131 and the contact pad structures CPS and between the contact pad structures CPS and the insulating patterns 143, as shown in FIGS. 3A and 3B, such that the third spacer may be omitted.

More specifically, referring to FIGS. 2A and 2B, the second air gap AG2 may have a ring shape similar to the third spacer 139 in plan view and may surround the lower portion of the landing pad LP. The second air gap AG2 may be coupled to the first air gap AG1 at a space between the bit line structures BLS and the contact pad structures CPS. Furthermore, the second air gap AG2 may extend between the insulating patterns 143 and the contact pad structures CPS from the first air gap AG1, along the first direction D1, and along multiple sides of the landing pads LP. For example, the first air gap AG1 and the second air gap AG2 may be coupled to (or fluidly communicated with; also referred to herein as communicatively coupled to) each other to form a single empty space. Since the second air gap AG2 may extend between the contact pad structures CPS and the insulating patterns 143 along the first direction D1, the second air gap AG2 may couple two adjacent parallel first air gaps AG1 extending in the second direction D2 together. The two adjacent first air gaps AG1 and the second air gap AG2 may be coupled to each other between the adjacent bit line structures BLS to form a single empty space.

In an example, the first air gap AG1 may have a first width defined as a distance between the first and second spacers 131 and 135, and the second air gap AG2 may have a second width defined as a distance between the first spacer 131 and the third spacer 139 (or a distance between each insulating pattern 143 and the third spacer 139). The first width may be equal to or greater than the second width.

Furthermore, the first air gap AG1 may include first portions adjacent to the contact pad structures CPS and second portions adjacent to the insulating patterns 143 (or between the contact pad structures in the second direction D2). A height of the first air gap AG1 may be greater at the second portions than at the first portions.

According to example embodiments, a pad insulating pattern LPI may fill between the upper portions of the landing pads LP. The pad insulating pattern LPI may have a rounded bottom surface. The second air gap AG2 may be closed by the bottom surface of the pad insulating pattern LPI. A top surface of the pad insulating pattern LP1 may be coplanar with the top surfaces of the landing pads LP.

The pad insulating pattern LPI may include a first capping insulating layer 161 and the second capping insulating layer 163 that are sequentially stacked. The first capping insulating layer 161 may have a substantially uniform thickness, and the second capping insulating layer 163 may fill between the landing pads LP. The first capping insulating layer 161 may directly contact the landing pads LP and the hard mask patterns 125 of the bit line structures BLS. Additionally, the first capping insulating layer 161 may extend on or cover the top surfaces of the insulating patterns 143 and may directly contact the second portions 135*b* of the second spacer 135 and a portion of the third spacer 139. The first and second capping insulating layer 161 and 163 may include a silicon oxide layer, a silicon nitride layer and/or a silicon oxynitride layer.

According to example embodiments, data storage patterns DSP may respectively be disposed on the contact pad structures CPS. The data storage patterns DSP may respectively be connected to the second impurity regions 1*b* via the respective contact pad structures CPS. The data storage patterns DSP may each be disposed at a position shifted from a central axis of each of the landing pads LP of the contact pad structures CPS and may contact a portion of each landing pad LP. In an example, the data storage patterns DSP may be arranged in either a honeycomb form or a zigzag form in plan view. In some embodiments, the data storage patterns DSP may overlap with the bit line structures BLS.

In some embodiments, the data storage patterns DSP may each be a capacitor, and may include a lower electrode, an upper electrode and a dielectric layer therebetween. In other embodiments, the data storage patterns DSP may each be a variable resistance pattern capable of switching between two resistance states by an electrical pulse applied to a memory element. For example, the data storage pattern DSP may include a phase change material capable of changing a crystalline state according to an amount of electrical current, such as perovskite compounds, transition metal oxide, magnetic materials, ferromagnetic materials or antiferromagnetic materials.

According to an example embodiment as shown in FIG. 2C, in the memory device as described with reference to FIGS. 1A, 1B and 1C, the first air gap AG1 may vertically extend along the sidewalls of the bit line contact pattern DC.

According to an example embodiment as shown in FIGS. 3A and 3B, in the memory device as described with reference to FIGS. 1A, 1B and 1C, the third spacer 139 may be omitted. Thus, the second air gap AG2 may be provided between the first spacer 131 and the pad structures CPS and between the insulating patterns 143 and the contact pad structures CPS.

FIGS. 4A, 5A, 6A, 7A, 8A, 9A, 10A, 11A, 12A, 13A and 14A are plan views illustrating a method of manufacturing a semiconductor memory device according to example embodiments. FIGS. 4B, 5B, 6B, 7B, 8B, 9B, 10B, 11B, 12B, 13B and 14B are cross-sectional views taken along lines A-A' and B-B' of FIGS. 4A to 14A, respectively. FIGS. 4C, 5C, 6C, 7C, 8C, 9C, 10C, 11C, 12C, 13C and 14C are cross-sectional views taken along lines C-C' and D-D' of FIGS. 4A to 14A, respectively.

Figure 4A:
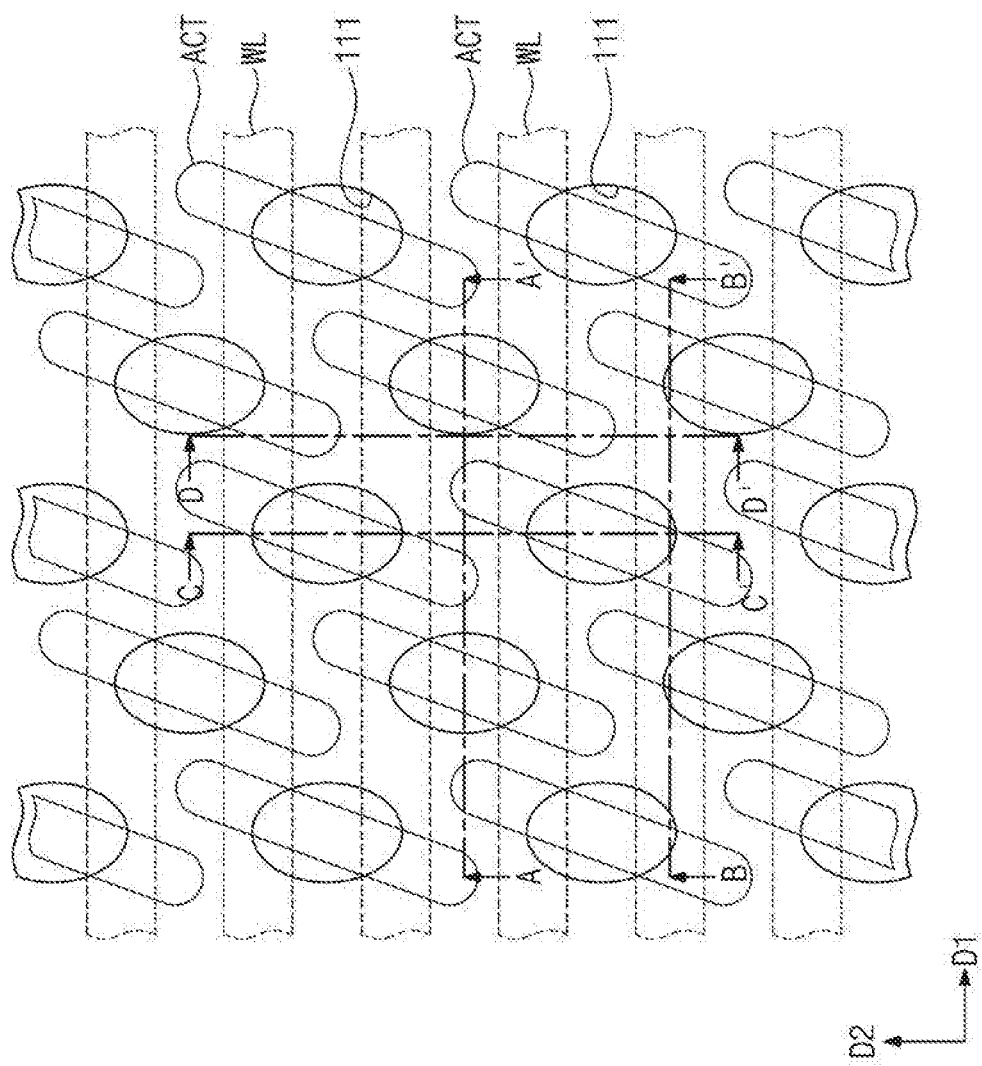
Figure 4B:
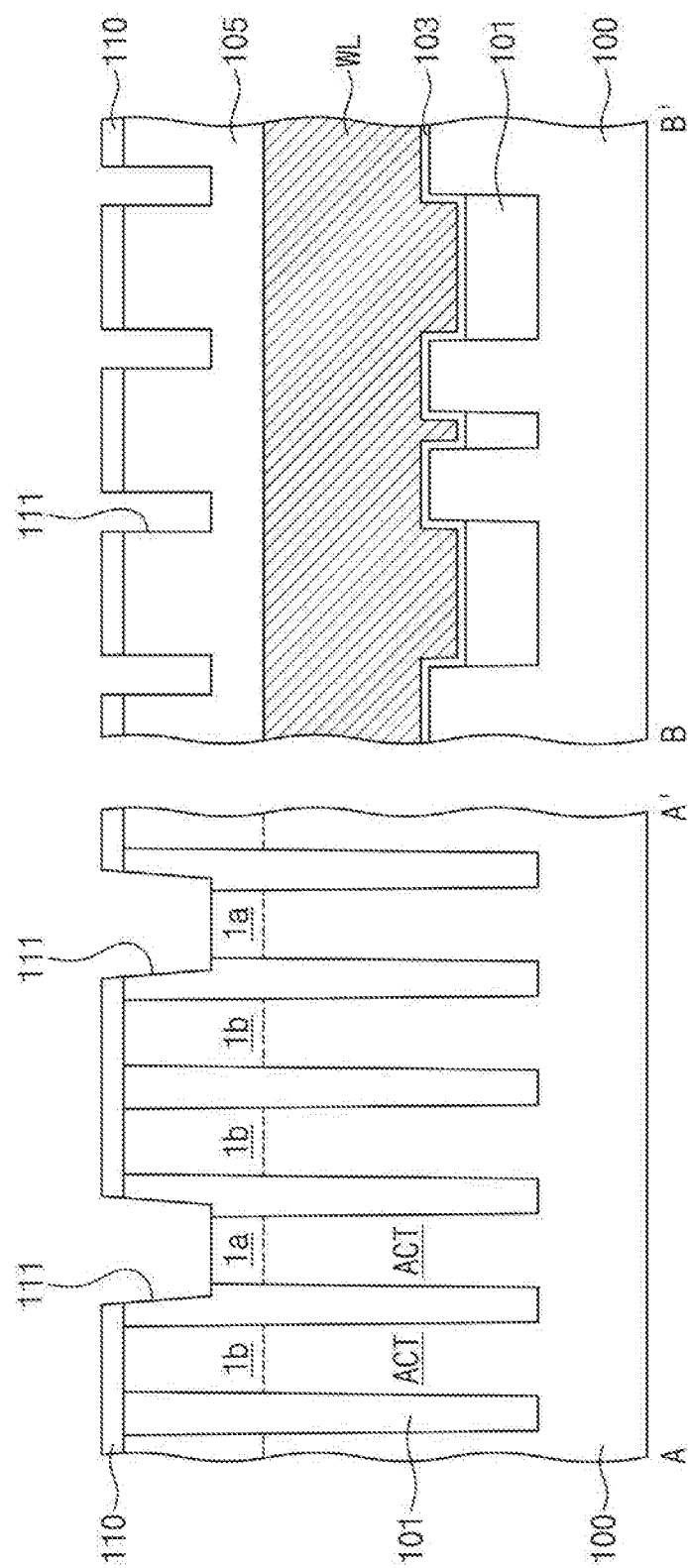
FIGS. 4B, 5B, 6B, 7B, 8B, 9B, 10B, 11B, 12B, 13B and 14B are cross-sectional views taken along lines A-A' and B-B' of FIGS. 4A to 14A, respectively.
Figure 4C:
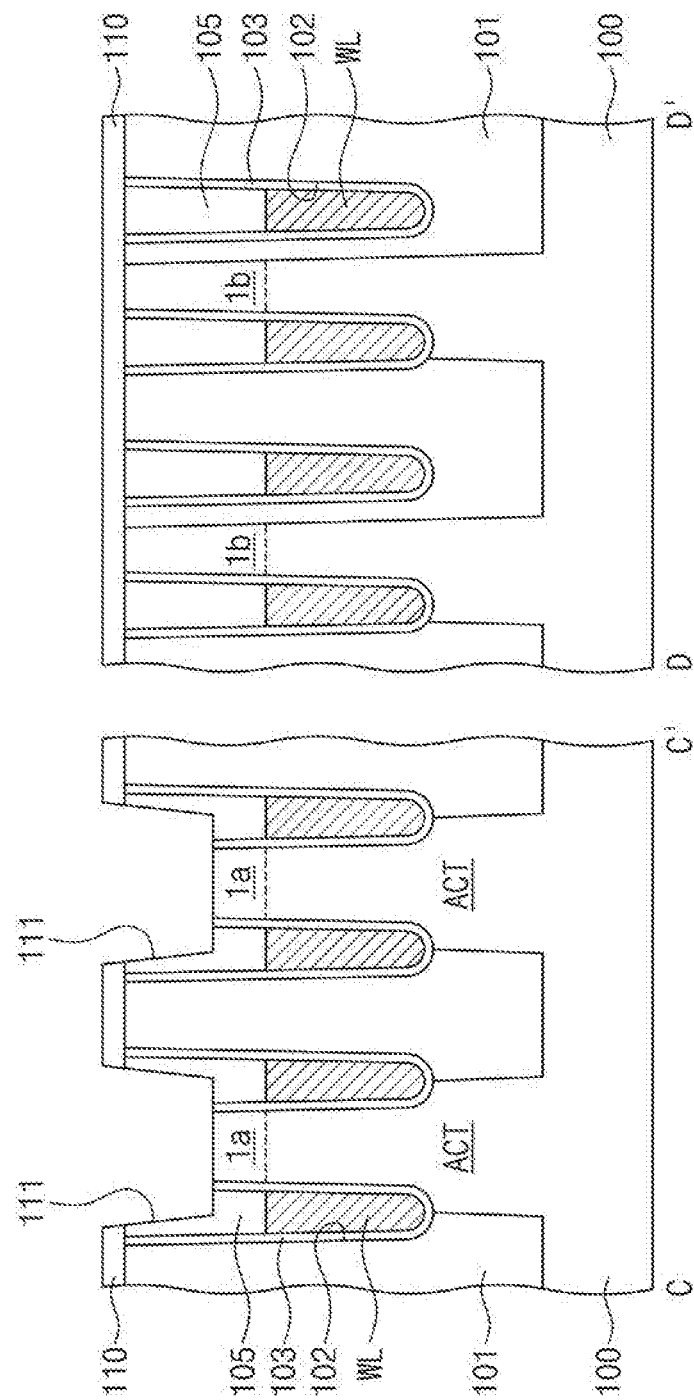
FIGS. 4C, 5C, 6C, 7C, 8C, 9C, 10C, 11C, 12C, 13C and 14C are cross-sectional views taken along lines C-C' and D-D' of FIGS. 4A to 14A, respectively.

Referring to FIGS. 4A, 4B and 4C, a device isolation layer 101 defining active regions ACT may be formed in a semiconductor substrate 100. In an example, the active regions ACT have a bar shape and may be arranged in two dimensions in a first direction D1 and a second direction D2 intersecting or crossing (e.g., perpendicular to) the first direction D1. The active regions ACT may be arranged in a zigzag form in plan view and may have a major axis oblique to both the first direction D1 and the second direction D2.

A plurality of word lines WL may be disposed on the semiconductor substrate 100 to extend in the direction D1. In an example, the active regions ACT and the device isolation layer 101 may be patterned to form gate recess regions 102 extending in the first direction D1, and after forming gate insulating layers in the gate recess regions 102, respectively, the word lines WL may be respectively formed on the gate insulating layers in the respective gate recess regions 102. Bottom surfaces of the gate recess regions 102 may be positioned higher than a bottom surface of the device isolation layer 101. Top surfaces of the word lines WL may be positioned lower than a top surface of the device isolation layer 101. Gate hard mask patterns 105 may be respectively formed in the gate recess regions 102 in which the word lines WL are formed.

After forming the word lines WL, first and second impurity regions 1*a* and 1*b* may be respectively formed in the active regions ACT at opposite sides of the word lines WL. The first and second impurity regions 1*a* and 1*b* may be formed by an ion implantation process and may include dopants of a conductivity type opposite to that of the active regions ACT.

An insulating interlayer 110 may be formed on the semiconductor substrate 100. The insulating interlayer 110 may be formed of either a single insulating layer or a plurality of insulating layers. The insulating interlayer 110 may include, for example, a silicon oxide layer, a silicon nitride layer and/or a silicon oxynitride layer.

According to example embodiments, the semiconductor substrate 100 and the insulating interlayer 110 may be patterned to form recess regions 111 respectively exposing the first impurity regions 1*a*. In an example, the recess regions 111 may have an elliptical shape having a major axis in the second direction D2. Additionally, the recess regions 111 may be arranged in either a honeycomb form or a zigzag form in plan view.

In some embodiments, the recess regions 111 may be formed by an anisotropic etching process. In this case, a portion of the device isolation layer 101 and a portion of each of the gate hard mask patterns 105 that are adjacent to the first impurity regions 1*a* may be etched together. Bottom surfaces of the recess regions 111 may be positioned higher than bottom surfaces of the first impurity regions 1*a*, and a portion of the device isolation layer 101 and a portion of each of the gate hard mask patterns 105 may be exposed by the recess regions 111.

Figure 5B:
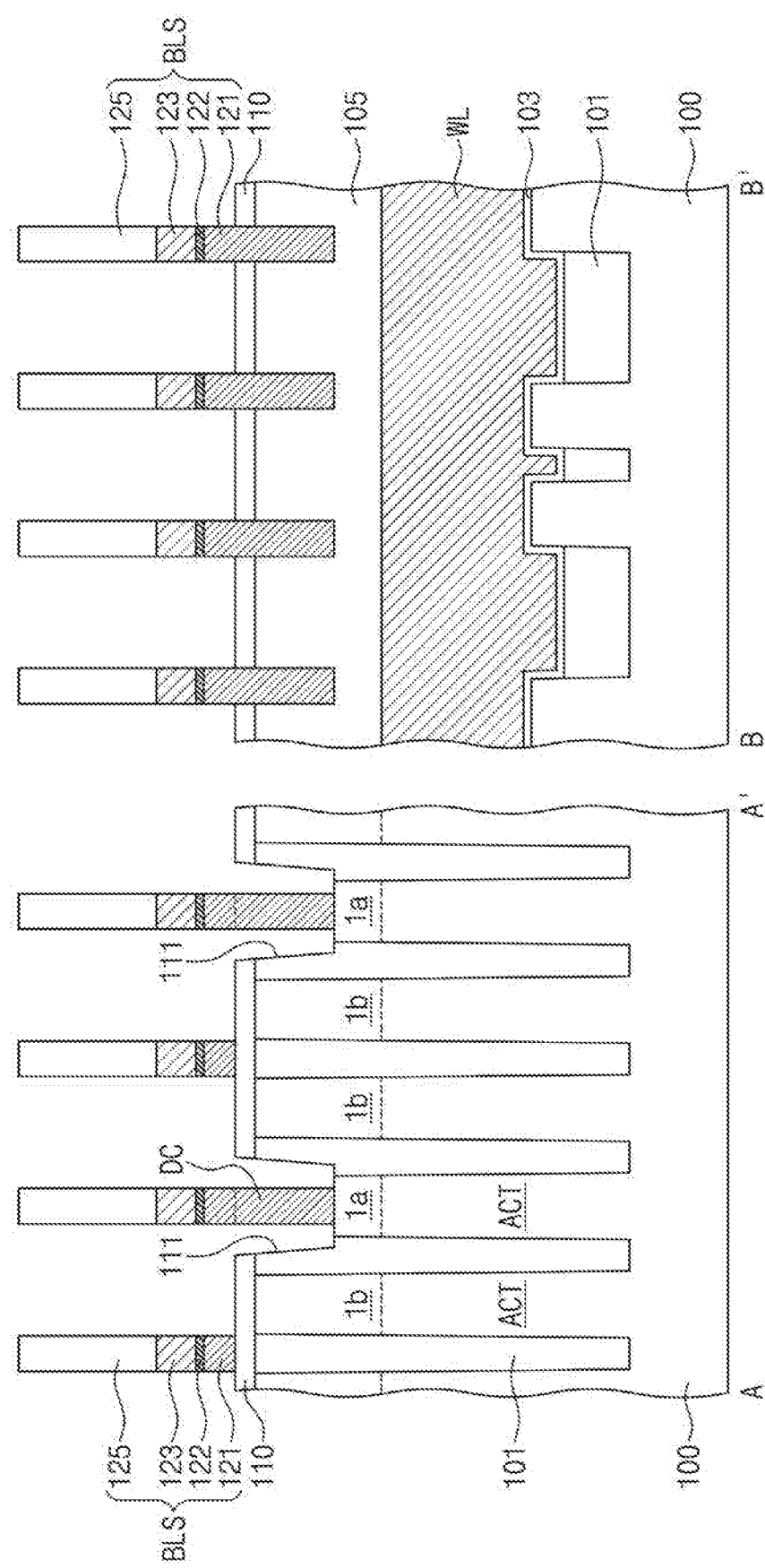
Figure 5C:
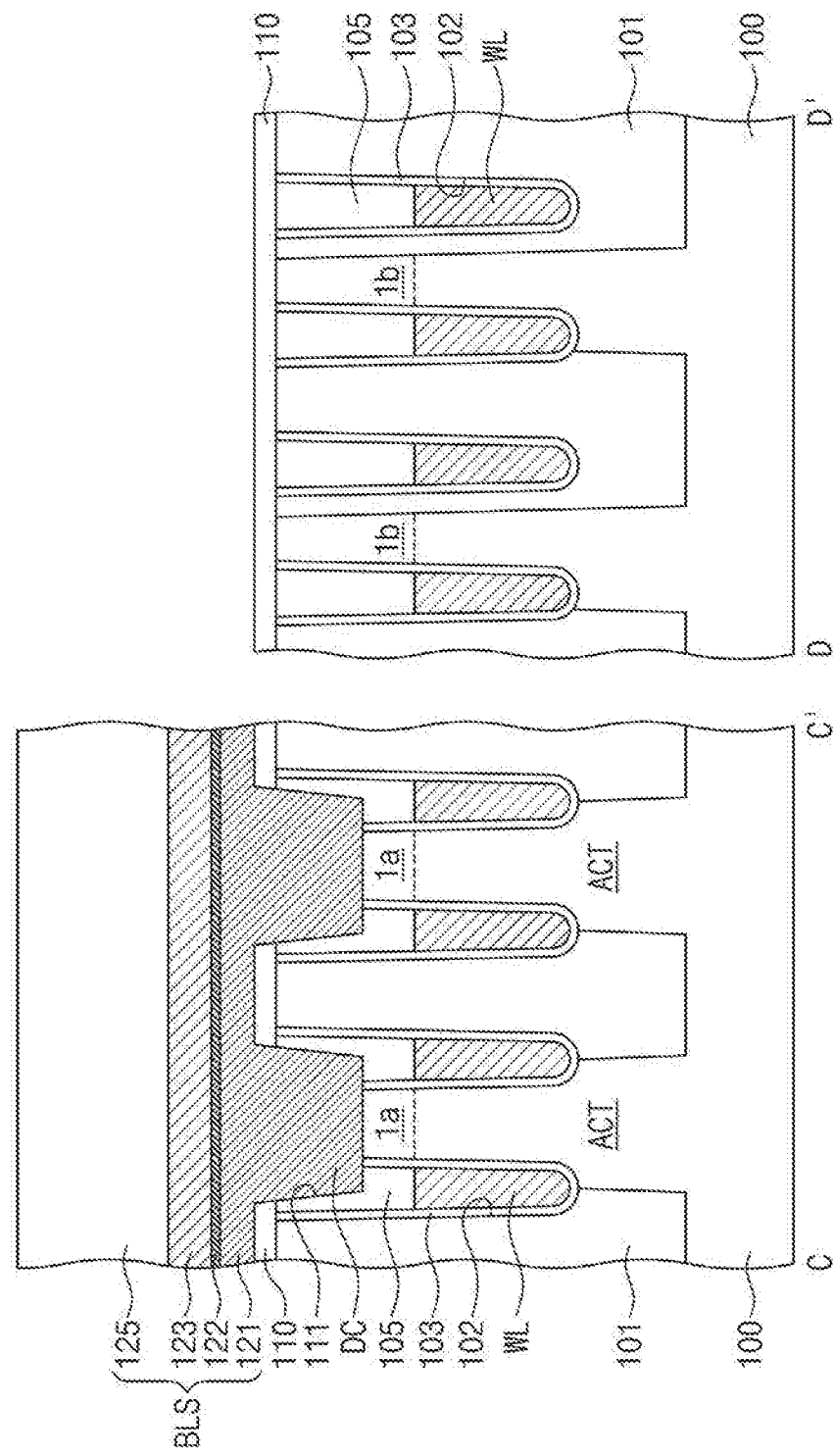

Referring to FIGS. 5A, 5B and 5C, bit line structures BLS may be formed on the insulating interlayer 110 having the recess regions 111 and may extend in the second direction D2.

The formation of the bit line structures BLS may include forming a first conductive layer on the insulating interlayer 110 to fill the recess regions 111, forming a second conductive layer on the first conductive layer, forming a hard mask layer on the second conductive layer, forming a bit line mask pattern on the hard mask layer, and sequentially etching the hard mask layer, the second conductive layer and the first conductive layer using the bit line mask pattern as an etch mask. The bit line mask pattern may be removed after etching the hard mask layer, the second conductive layer and the first conductive layer. Here, the first conductive layer may be formed of a doped semiconductor layer (e.g., a doped polysilicon layer), and the second conductive layer may be formed of a metal layer such as a tungsten layer, an aluminium layer, a titanium layer or a tantalum layer. Furthermore, a metal silicide layer may be formed between the first conductive layer and the second conductive layer.

Thus, the bit line structures BLS may each include a polysilicon pattern 121, a silicide pattern 122, a metal pattern 123 and a hard mask pattern 125 that are sequentially stacked. Here, a portion of the polysilicon pattern 121 may be locally formed in the recess regions 111 to form a bit line contact pattern DC that directly contacts the first impurity region 1a. Additionally, sidewalls of the polysilicon pattern 121 may be spaced apart from sidewalls of the respective recess regions 111.

Figure 6B:
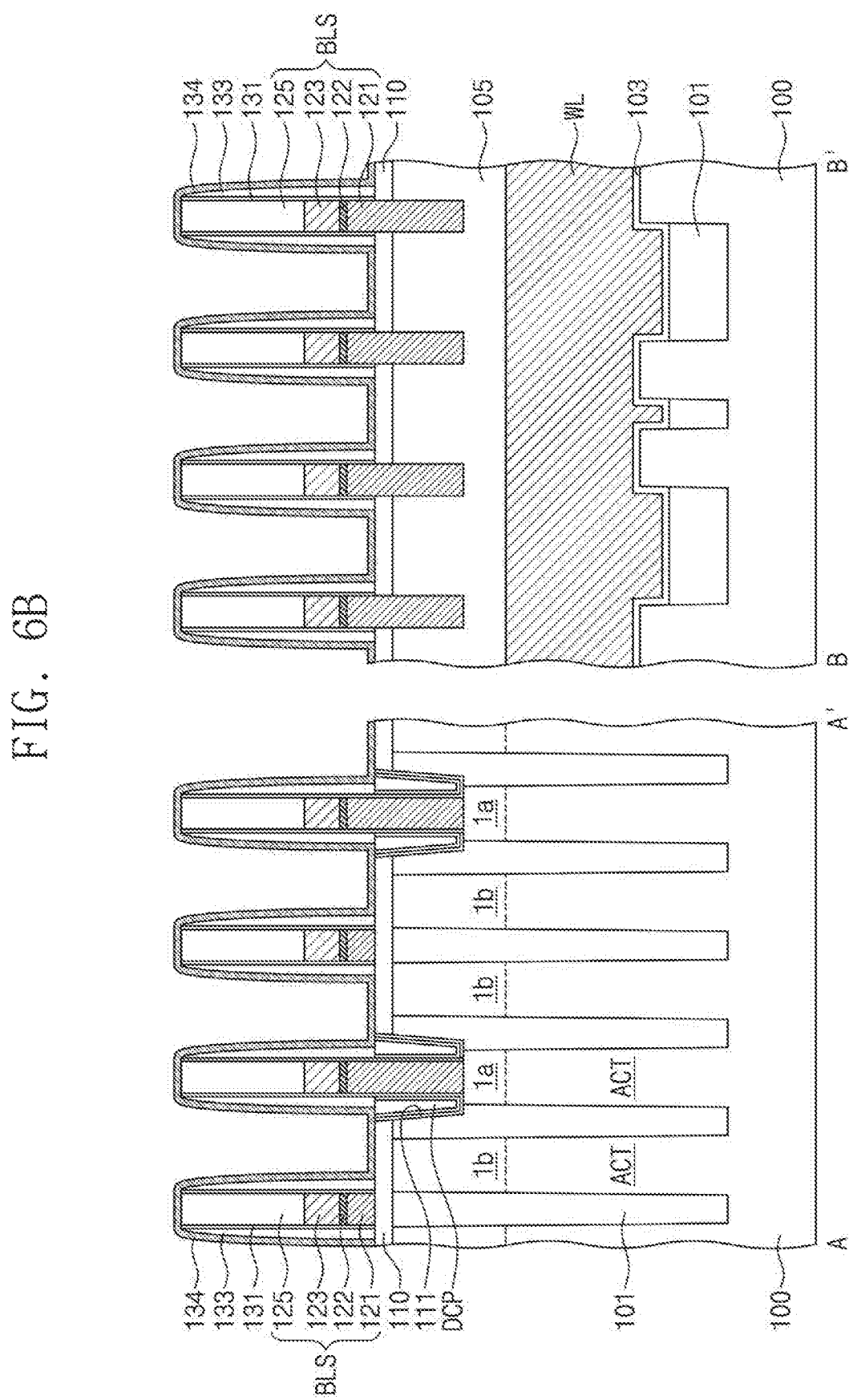
Figure 6C:
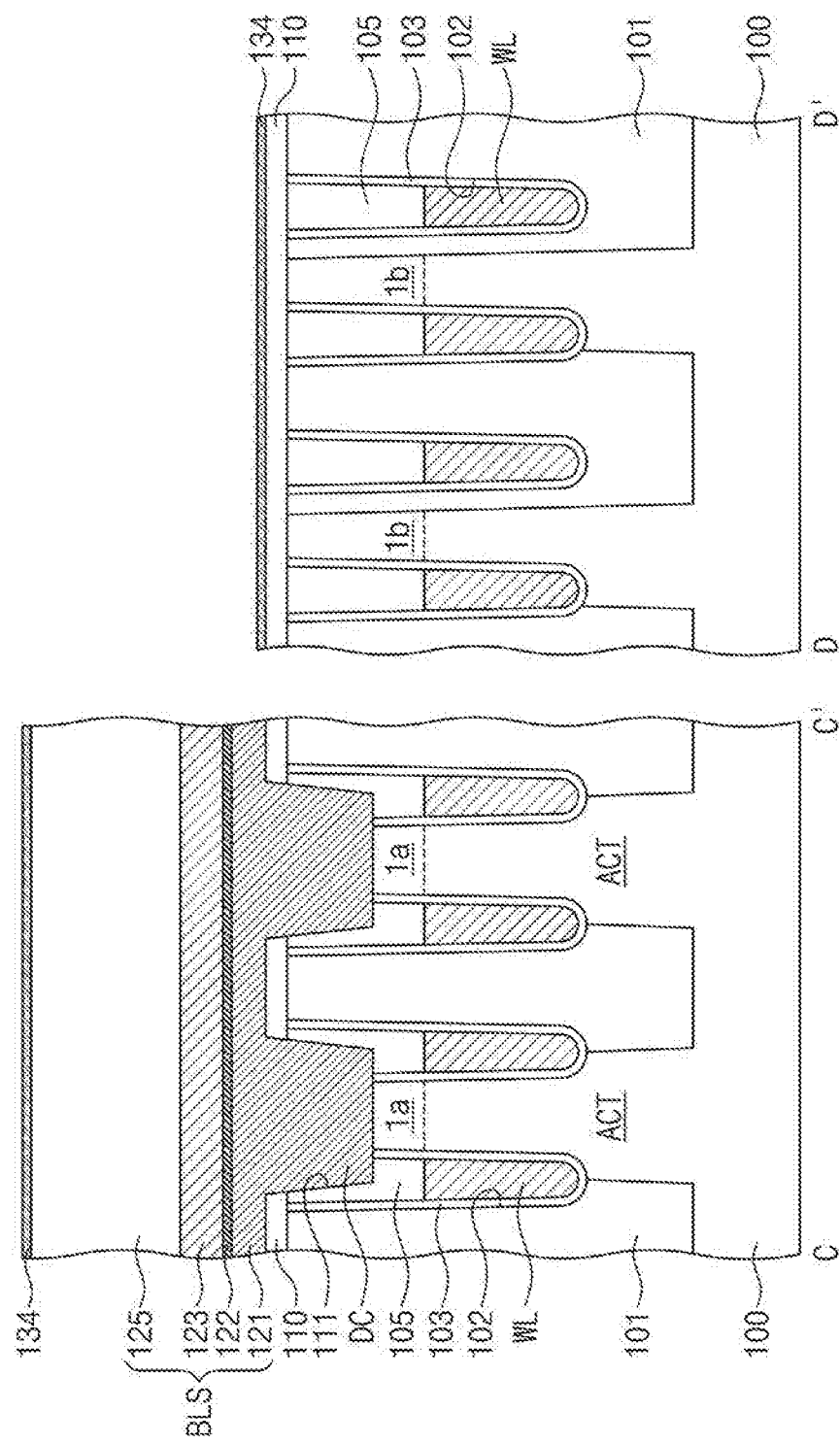

Referring to FIGS. 6A, 6B and 6C, a first spacer 131 and a first sacrificial spacer 133 may be formed on opposite sidewalls of each of the bit line structures BLS.

More specifically, the formation of the first spacer 131 may include depositing a spacer layer that fills the recess regions 111 and conformally covers the bit line structures BLS and anisotropically etching the spacer layer. Here, the spacer layer may include a first nitride layer, an oxide layer and a second nitride layer that are sequentially stacked. When anisotropically etching the spacer layer (i.e., the second nitride layer), the oxide layer may be used as an etch stop layer, and the oxide layer and the second nitride layer may locally remain in the recess regions 111 to form a bit line contact spacer DCP. The first nitride layer may remain the recess regions 111 and the opposite sidewalls of the respective bit line structures BLS to form the first spacer 131. The first spacer 131 may include a lower portion formed in the recess regions 111 and an upper portion covering the opposite sidewalls of the respective bit line structures BLS. The lower portion of the first spacer 131 may form the bit line contact spacer DCP. The first spacer 131 may extend in the second direction D2 along the opposite sidewalls of the respective bit line structures BLS. In some embodiments, the first spacer 131 may fill the recess regions 111 and extend along the opposite sidewalls of the respective bit line structures BLS.

After forming the first spacer 131, a first sacrificial layer may be formed to conformally extend on or cover a part of or an entire surface of the resulting structure, and the first sacrificial layer may be anisotropically etched to form the first sacrificial spacer 133 on the opposite sidewalls of the respective bit line structures BLS according to some embodiments. The first sacrificial spacer 133 may be formed of an insulating material having an etch selectivity with respect to the first spacer 131, for example, silicon oxide. The first sacrificial spacer 133 may be disposed on the first spacer 131 and may extend in the second direction D2 along the opposite sidewalls of the respective bit line structures BLS.

After forming the first sacrificial spacer 133, a second spacer layer 134 may be formed to conformally extend on or cover the bit line structures BLS, the first sacrificial spacer 133 and the insulating interlayer 110. The second spacer layer 134 may be formed of an insulating material having an etch selectivity with respect to both the first sacrificial spacer 133 and the insulating interlayer 110. The second spacer layer 134 may be formed of, for example, a silicon nitride layer and/or a silicon oxynitride layer.

Figure 7A:
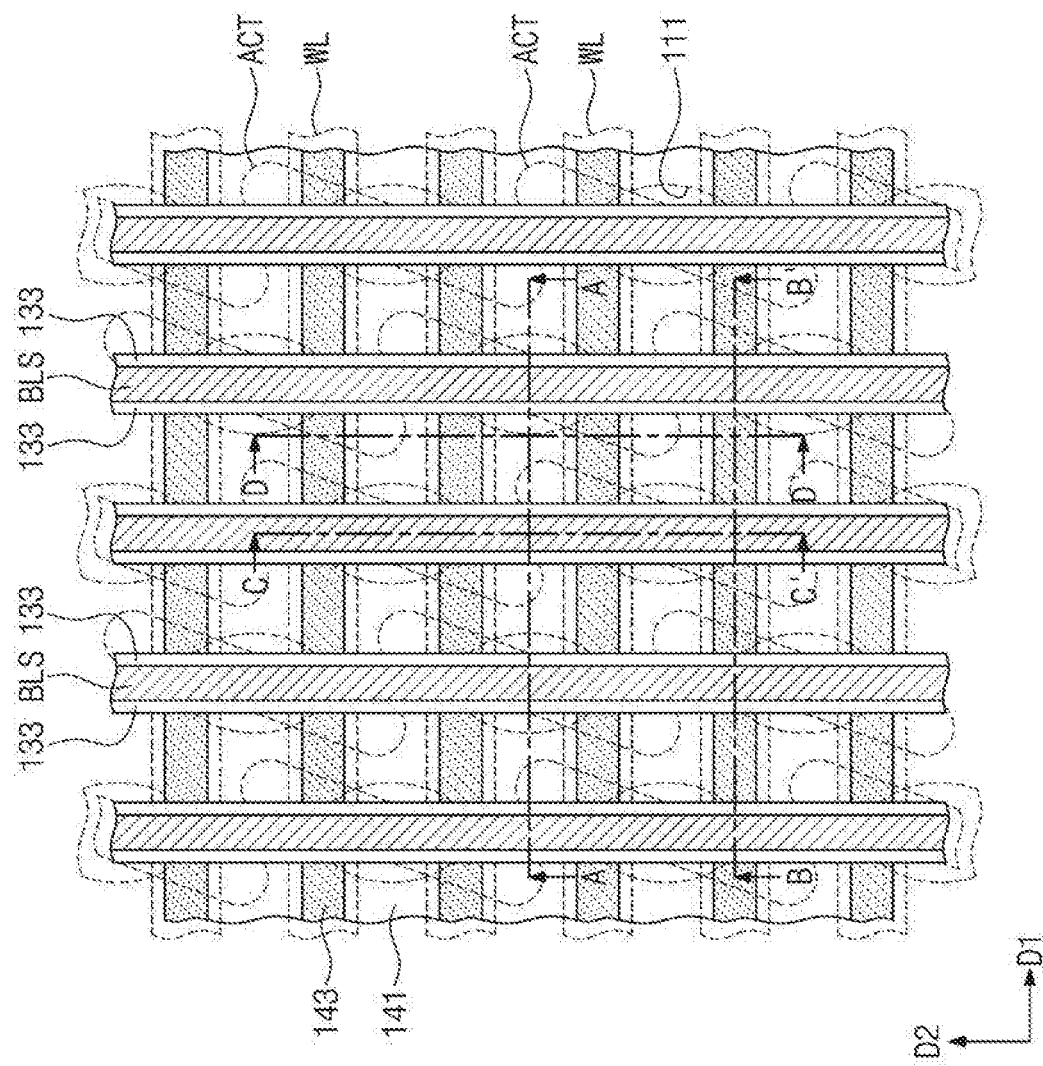
Figure 7B:
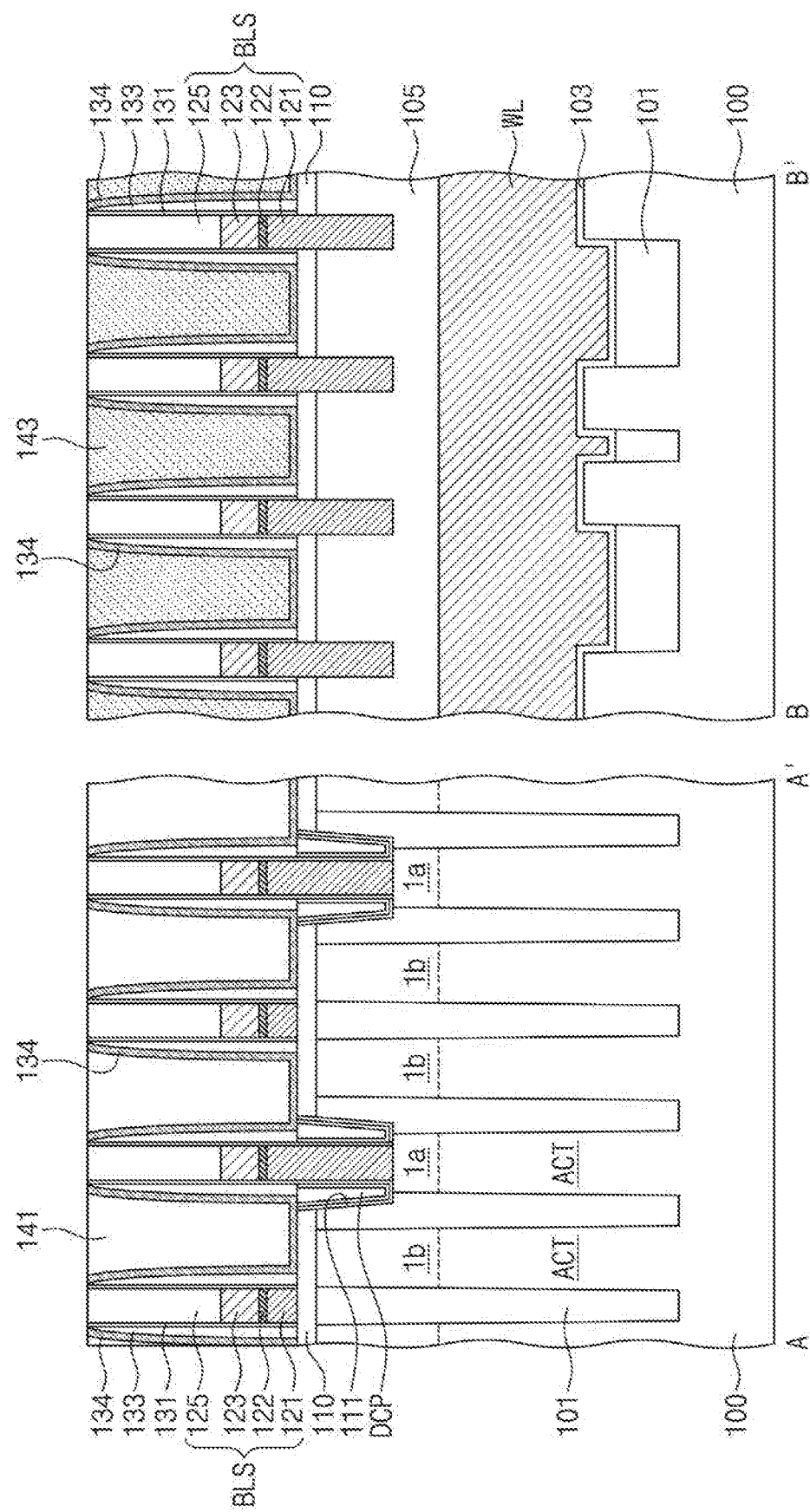
Figure 7C:
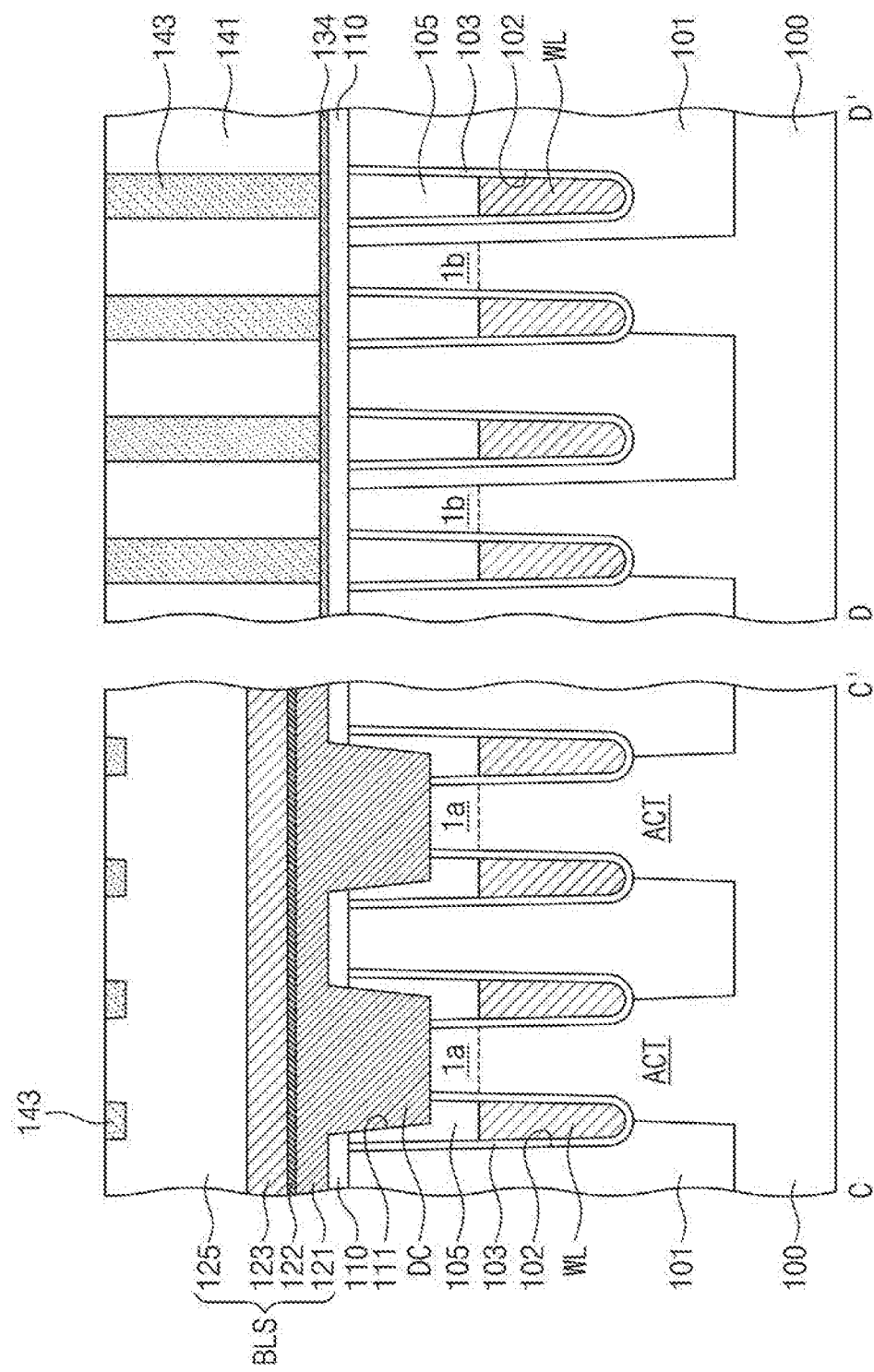

Referring to FIGS. 7A, 7B and 7C, sacrificial patterns 141 and insulating pattern 143 may be formed to be alternately arranged along the second direction D2 between the bit line structures BLS. For example, the insulating patterns 143 may be formed on the word lines WL, respectively, and the sacrificial patterns 141 may be formed on the second impurity regions 1b, respectively.

In an example, the formation of the sacrificial patterns 141 and the insulating patterns 143 may include forming a sacrificial layer on the second spacer layer 134 to fill between the bit line structures BLS, forming, on the sacrificial layer, mask patterns extending parallel to the word lines WL in the first direction D1, anisotropically etching the sacrificial layer using the mask patterns and the bit line structures BLS as an etch mask to form the sacrificial patterns 141 exposing the second spacer layer 134 on the word lines WL, forming the insulating layer filling between the sacrificial patterns 141 and between the bit line structures BLS, and planarizing the insulating layer to expose top surfaces of the mask patterns.

In plan view, the sacrificial patterns 141 may be spaced apart from each other in the second direction D2 and may be disposed between the word lines WL. The sacrificial patterns 141 may be formed of a material having an etch selectivity with respect to the second spacer layer 134. For example, the sacrificial patterns 141 may be formed of a spin-on-hard mask (SOH) material (e.g., SOH silicon oxide). When forming the sacrificial patterns 141, upper surfaces of the bit line structures BLS between the mask patterns may be partially etched.

The insulating patterns 143 may fill a space defined by the bit line structures BLS and the sacrificial patterns 141 and may overlap with the word lines WL in plan view. The insulating patterns 143 may be formed of an insulating material having an etch selectivity with respect to the sacrificial patterns 141. For example, the insulating patterns 143 may be formed of silicon oxide, silicon nitride and/or silicon oxynitride.

Figure 8A:
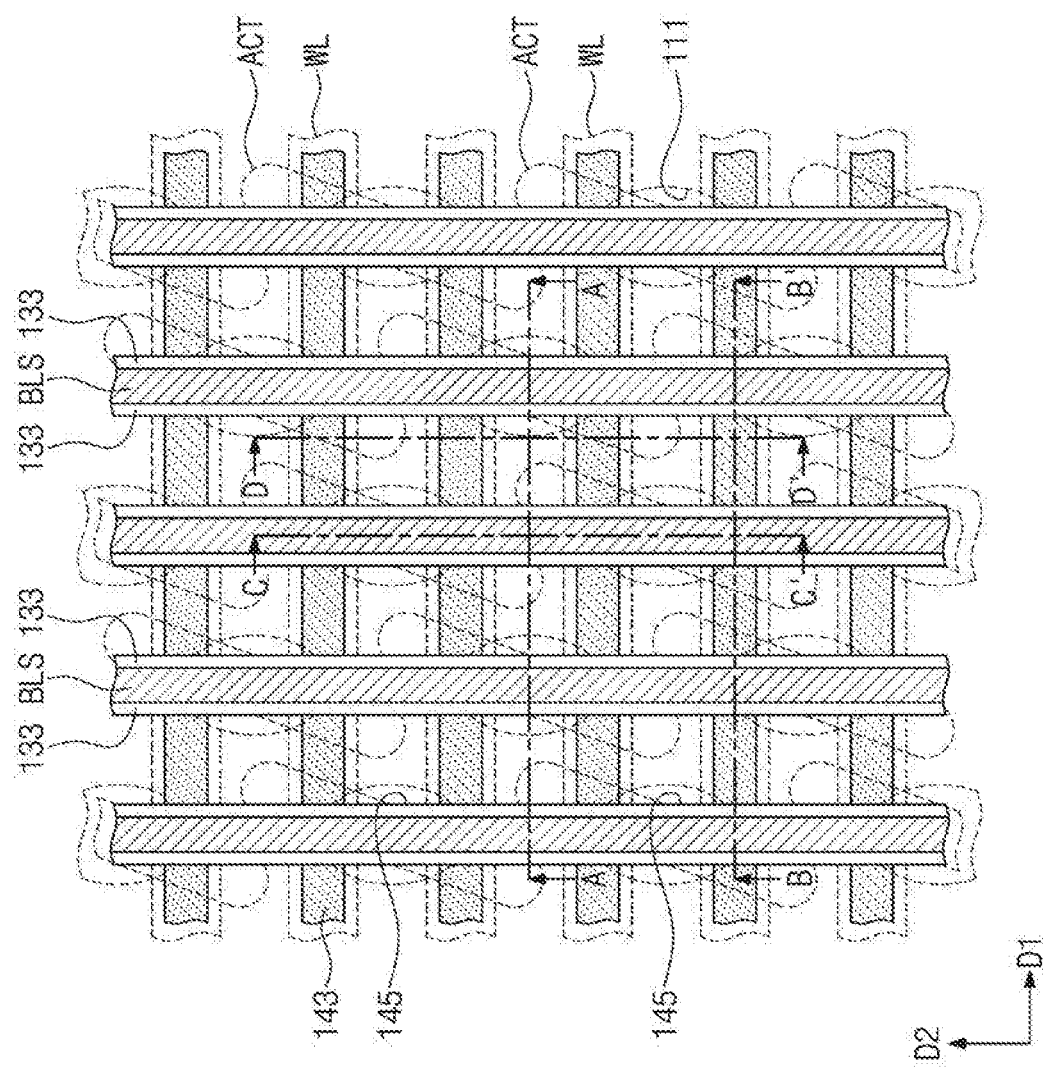
Figure 8B:
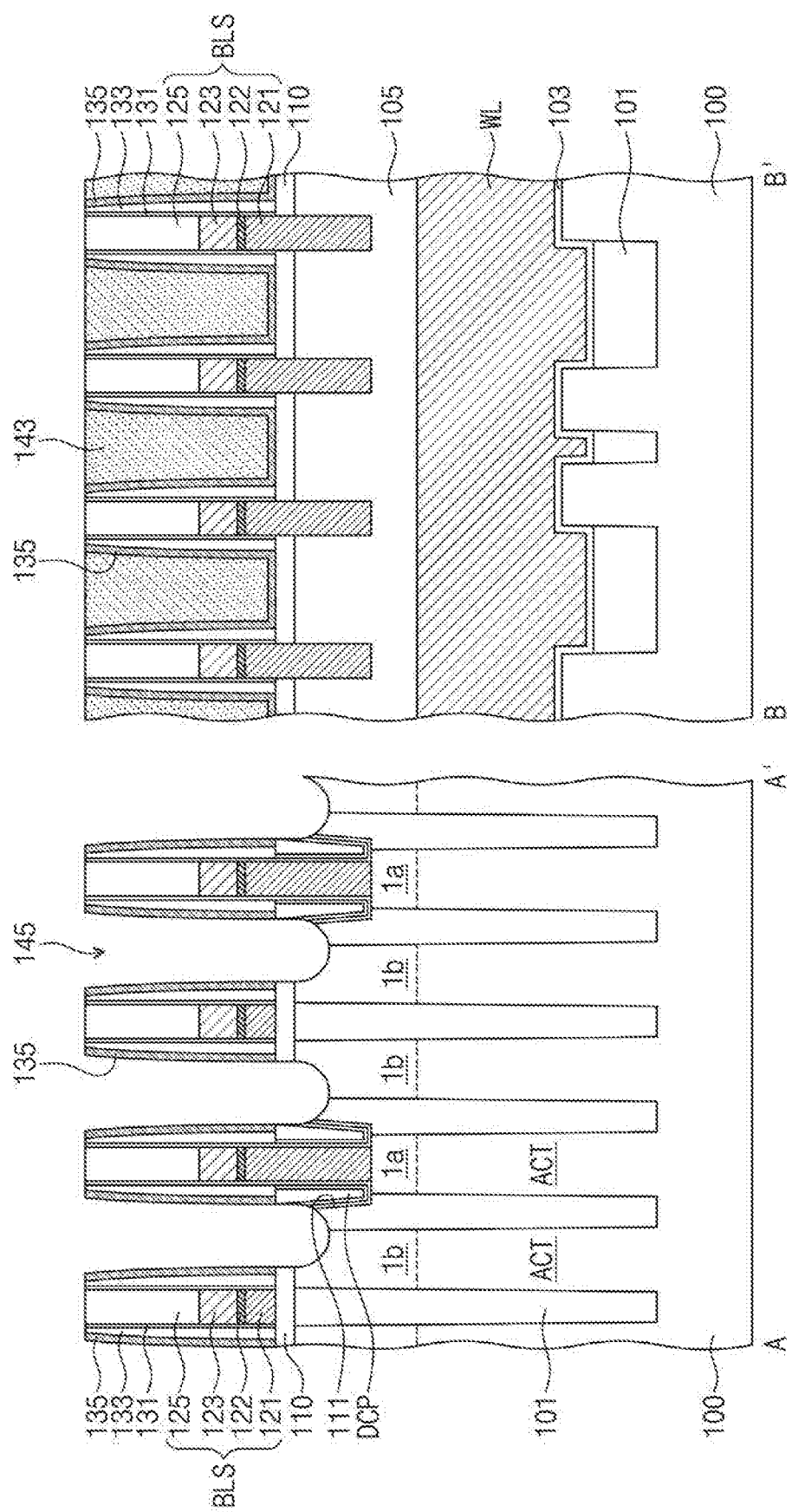
Figure 8C:
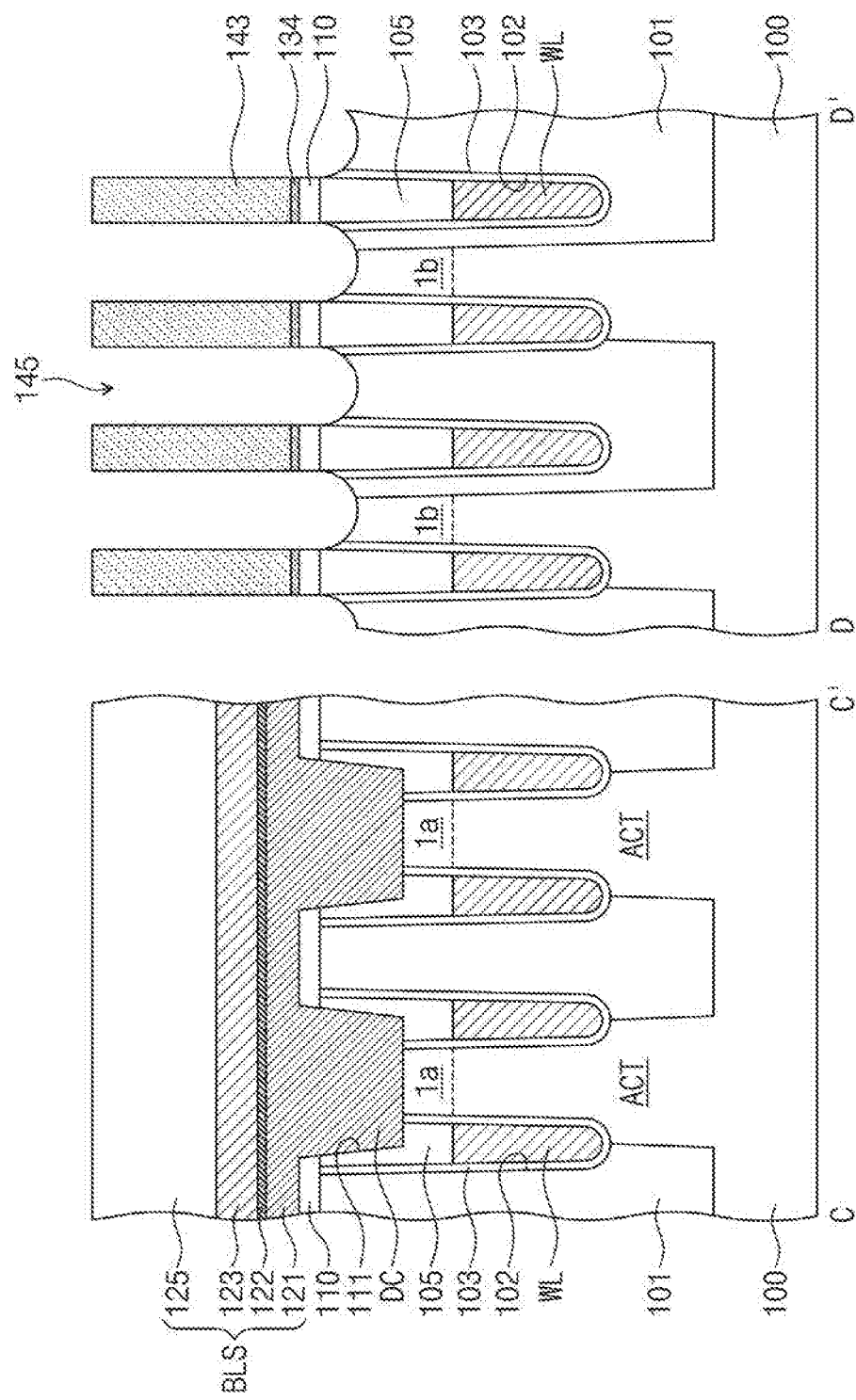

Referring to FIGS. 8A, 8B and 8C, after forming the insulating patterns 143, the sacrificial patterns 141 may be removed using an etch recipe having an etch selectivity with respect to the insulating patterns 143 and the second spacer layer 134. Thus, a contact region may be defined by the bit line structures BLS and the insulating patterns 143, and a portion of the second spacer layer 134 may be exposed.

Subsequently, the portion of the second spacer layer 134 exposed by the contact region, a portion of the insulating interlayer 110 and a portion of the semiconductor substrate 100, a portion of the device isolation layer 101 may be anisotropically etched using the insulating patterns 143 and the bit line structures BLS as an etch mask to form contact holes 145 exposing the second impurity regions 1b, respectively. As the contact holes 145 are formed, a second spacer 135 may be formed on the opposite sidewalls of the respective bit line structures BLS.

As the portion of the semiconductor substrate 100 and the portion of the device isolation layer 101 are etched when forming the contact holes 145, bottom surfaces of the contact holes 145 may be positioned lower than a top surface of the semiconductor substrate 100. The contact holes 145 may expose a portion of the bit line contact spacer DCP in the recess regions 111.

Figure 9A:
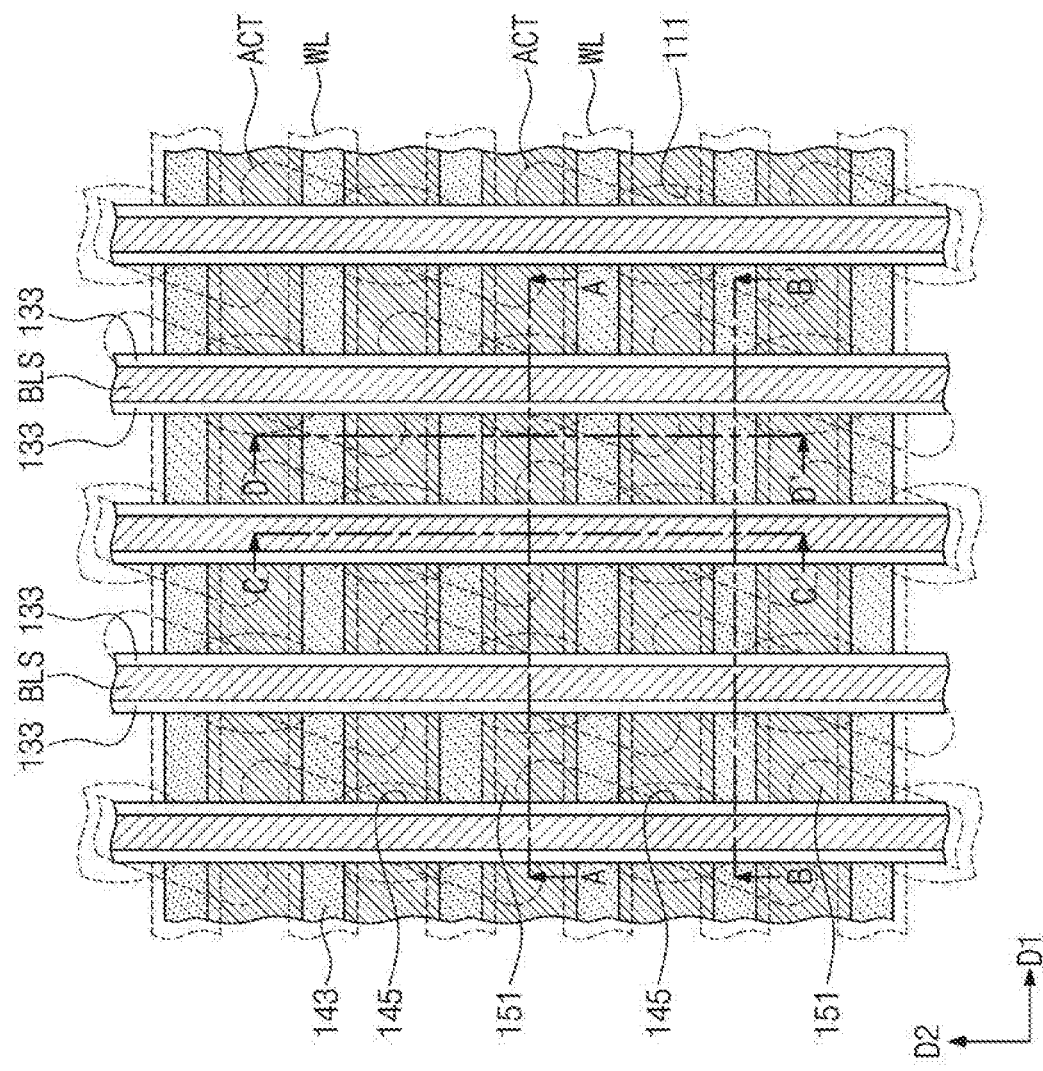
Figure 9B:
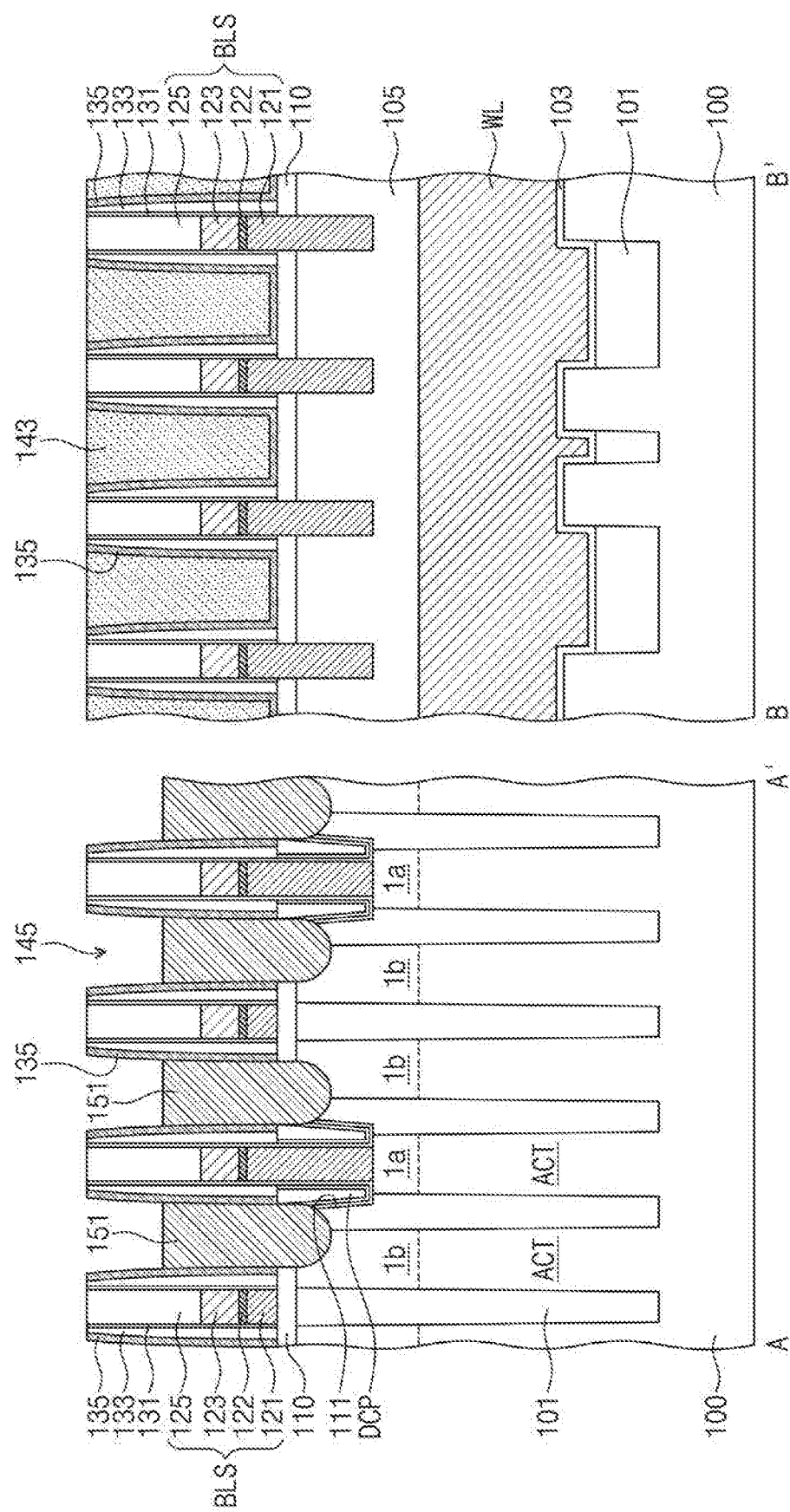
Figure 9C:
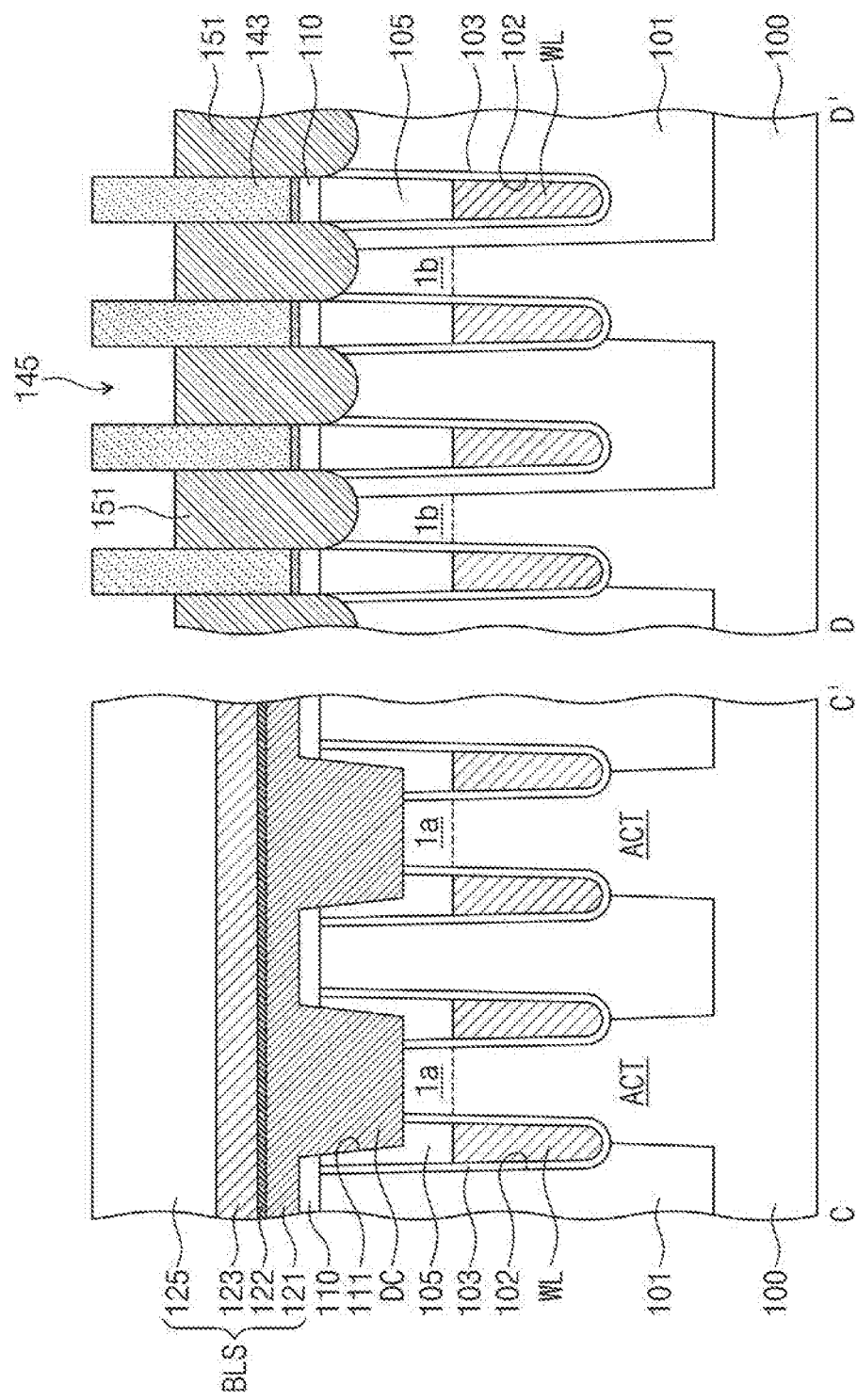

Referring to FIGS. 9A, 9B and 9C, preliminary contact patterns 151 may be formed in the contact holes 145, respectively. The preliminary contact patterns 151 may each be formed to fill a portion of each of the contact holes 145. In an example, top surfaces of the preliminary contact patterns 151 may be positioned lower than top surfaces of the hard mask patterns 125 of the bit line structures BLS.

The formation of the preliminary contact patterns 151 may include depositing a conductive layer to fill the contact holes 145, planarizing the conductive layer to expose top surfaces of the bit line structures BLS and the insulating patterns 143, and recessing a top surface of the conductive layer. As a result, the preliminary contact patterns 151 are formed to expose an upper portion of the second spacer 135 to the contact holes 145.

The preliminary contact patterns 151 may include, for example, a doped semiconductor material (e.g., doped silicon), metal (e.g., tungsten, aluminium, titanium and/or tantalum), conductive metal nitride (e.g., titanium nitride, tantalum nitride, and/or tungsten nitride) and/or metal-semiconductor alloy (e.g., metal silicide).

In some embodiments, while forming the preliminary contact patterns 151, the top surfaces of the insulating patterns 143 and the bit line structures BLS may be recessed, and thus top surfaces of the first sacrificial spacer 133 and the first and second spacers 131 and 135 may be exposed.

Figure 10B:
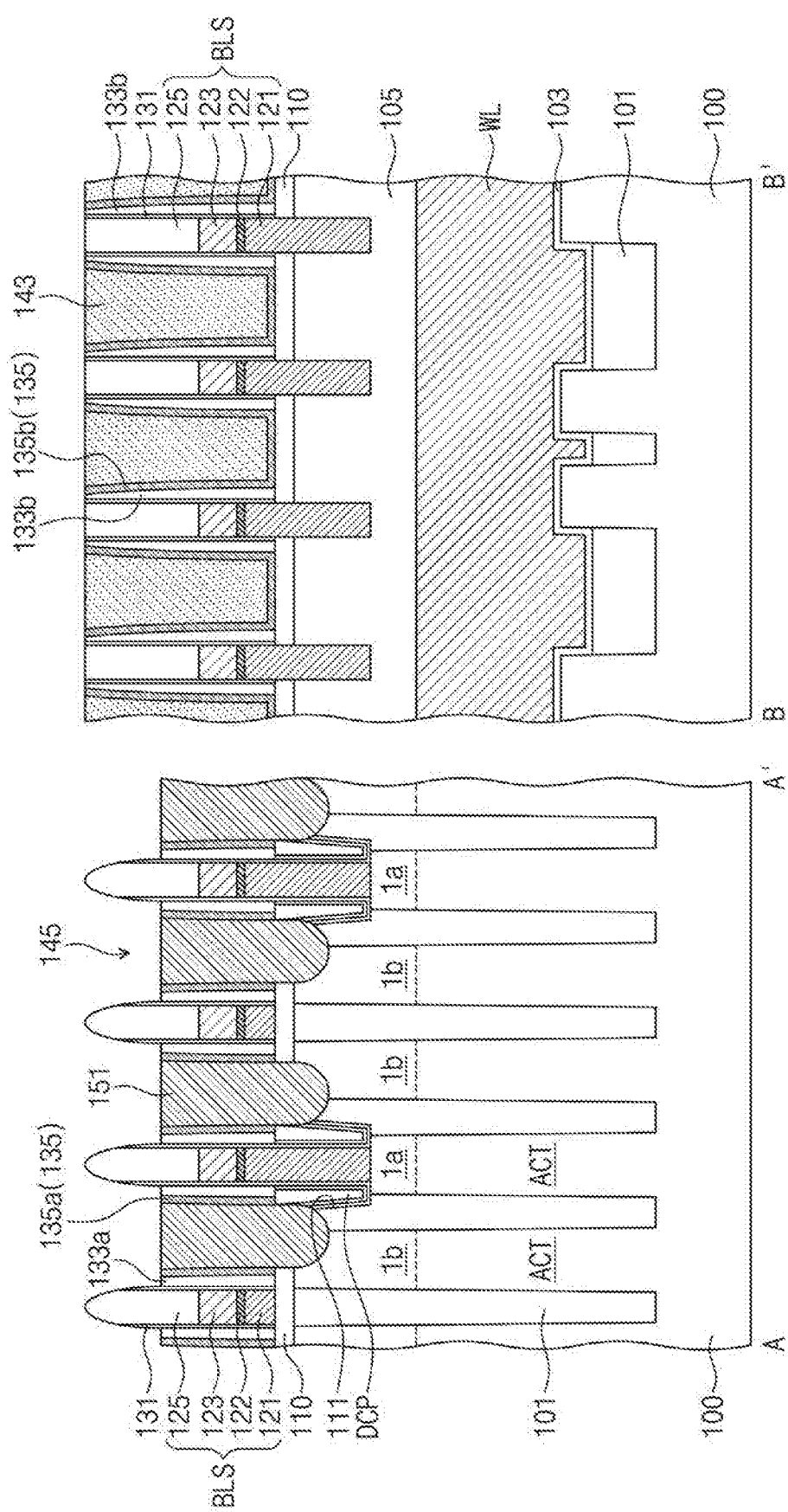
Figure 10C:
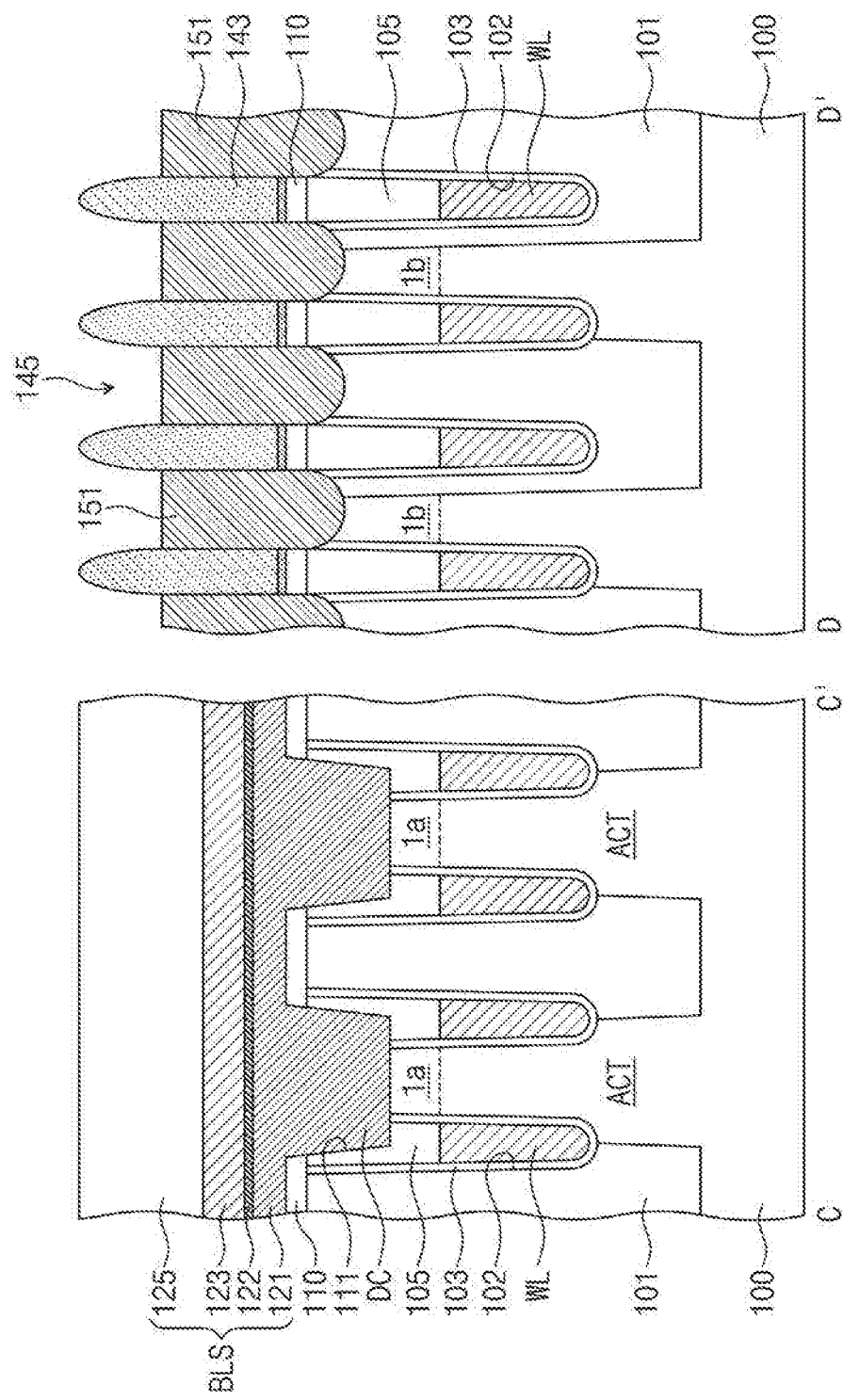

Referring to FIGS. 10A, 10B and 10C, after forming the preliminary contact patterns 151, the upper portion of the second spacer 135 exposed by the contact holes 145 and an upper portion of the first sacrificial spacer 133 are may be etched. For example, the second spacer 135 exposed by the contact hole 145 and the first sacrificial spacer 133 may be etched by either an anisotropic etch process or an isotropic etch process. A top surface of the etched first sacrificial spacer 133 and a top surface of the etched second spacer 135 may be positioned at substantially the same level. As the first sacrificial spacer 133 and the second spacer 135 are etched, an upper width of each of the contact holes 145 that are not filled by the preliminary contact patterns 151 may be increased. Furthermore, while etching the upper portions of the second spacer 135 and the first sacrificial spacer 133, a portion of the hard mask pattern 125 of each of the bit line structures BLS may be etched together, thereby reducing an upper width of the hard mask pattern 125. As a result, the first sacrificial spacer 133 and the second spacer 135 may respectively include first portions 133a and 135a between the preliminary contact patterns 151 and the bit line structures BLS and second portions 133b and 135b between the insulating patterns 143 and the bit line structures BLS. Top surfaces of the first portions 133a and 135a may be positioned lower than those of the second portions 133b and 135b. For example, the first portions 133a and 135a may have a lower height than the second portions 133b and 135b.

Figure 11A:
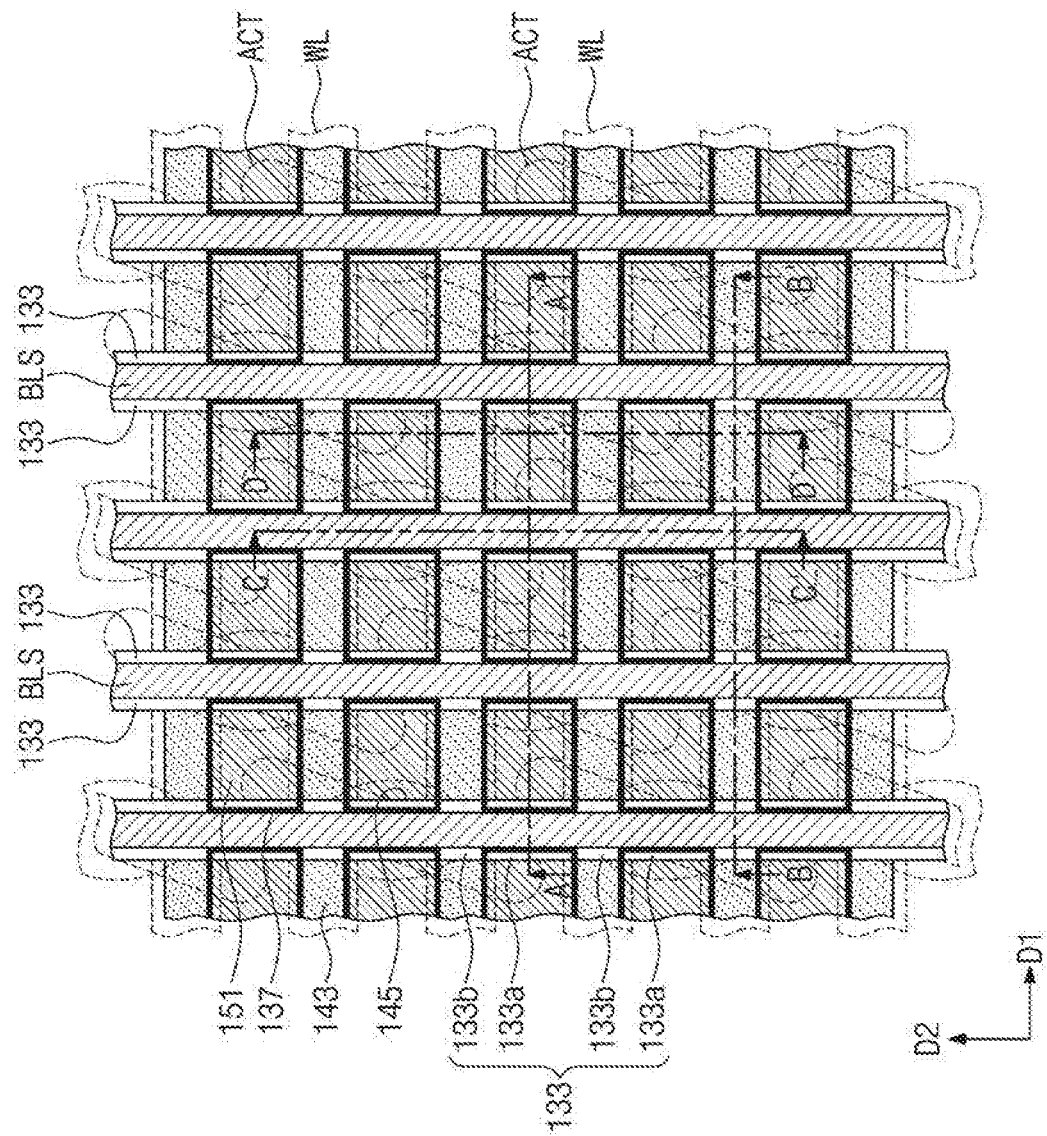
Figure 11B:
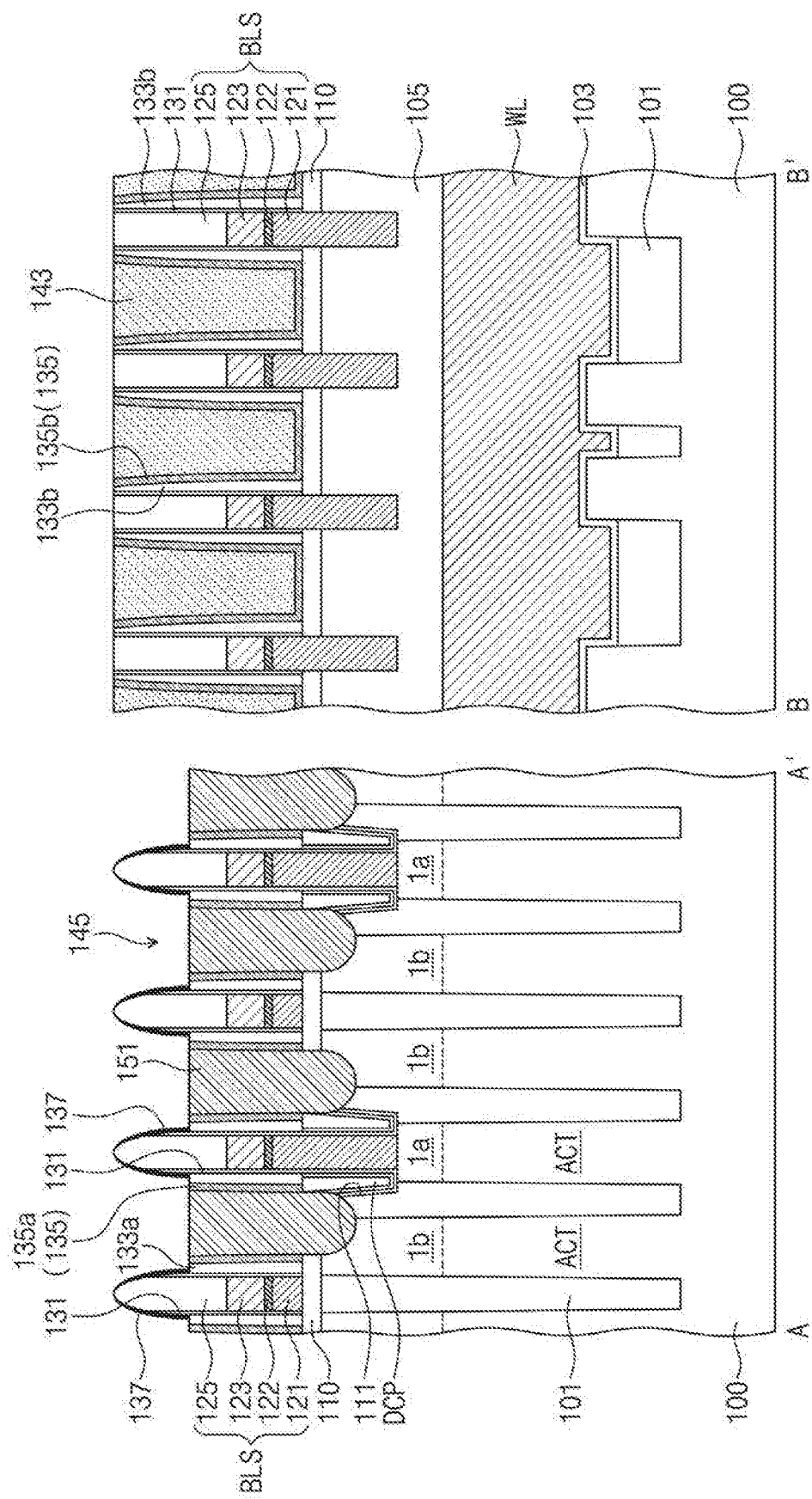
Figure 11C:
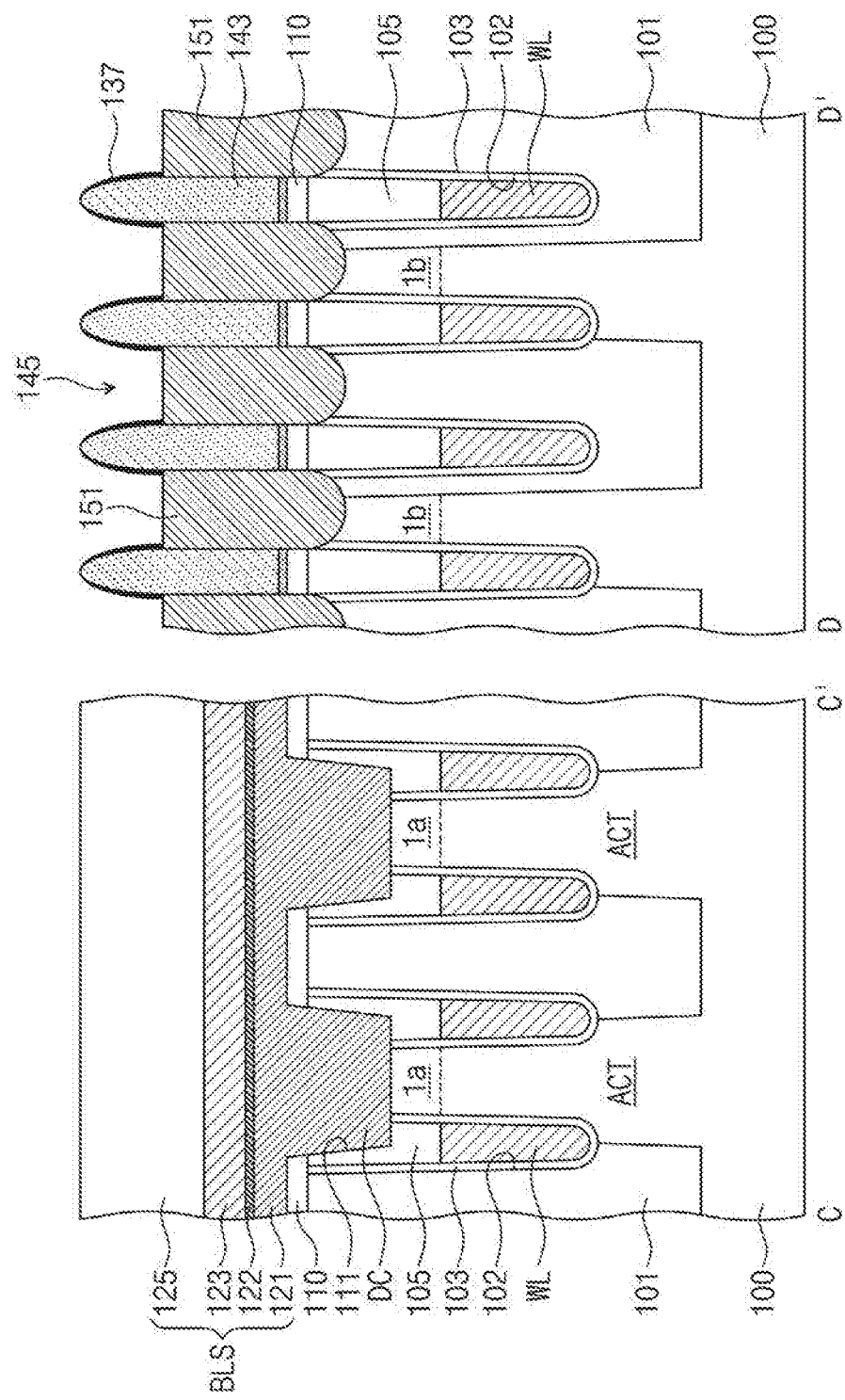

Referring to FIGS. 11A, 11B and 11C, a second sacrificial spacer 137 having a ring shape in plan view may be formed in the contact holes 145.

The formation of the second sacrificial spacer 137 may include forming a second sacrificial spacer layer that conformally covers inner surfaces of upper portions of the contact holes 145, and anistropically etching (e.g., etching-back) the second sacrificial spacer layer to expose the top surfaces of the preliminary contact patterns 151. The second sacrificial spacer 137 may be disposed on the first portions 133a and 135a of the first sacrificial spacer 133 and the second spacer 135 and may conformally extend on or cover the first spacer 131 and portions of sidewalls of the insulating patterns 143. In some embodiments, a thickness of the second sacrificial spacer 137 may be equal to or less than that of the first sacrificial spacer 133. The second sacrificial spacer 137 may directly contact a top surface of the first sacrificial spacer 133 (e.g., top surfaces of the first portions 133a). Furthermore, the second sacrificial spacer 137 may directly contact two adjacent first sacrificial spacers 133 in the respective contact holes 145. The second sacrificial spacer 137 may be formed of the same material as the first sacrificial spacer 133 and may be formed of a material having an etch selectivity relative to the first and second spacers 131 and 135.

Figure 12A:
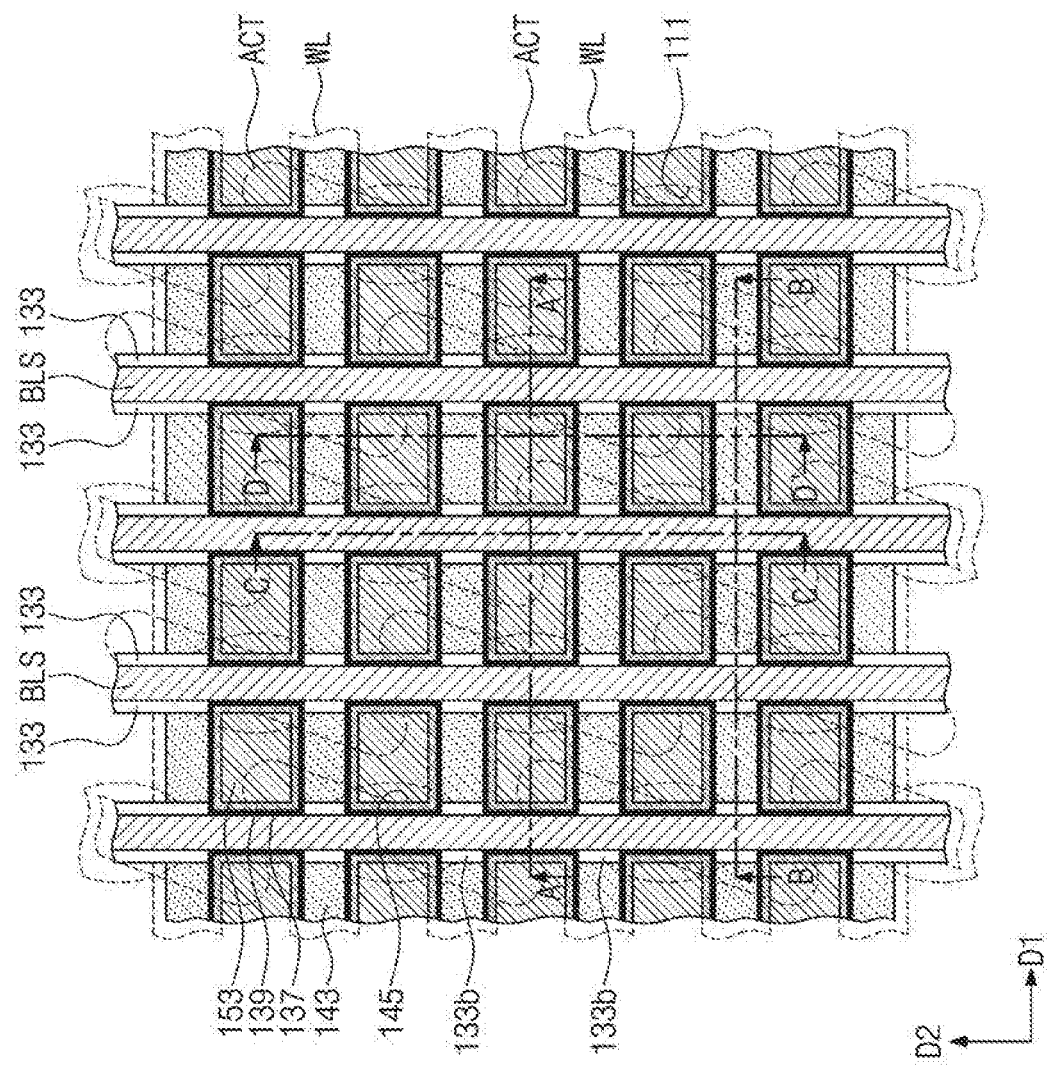
Figure 12B:
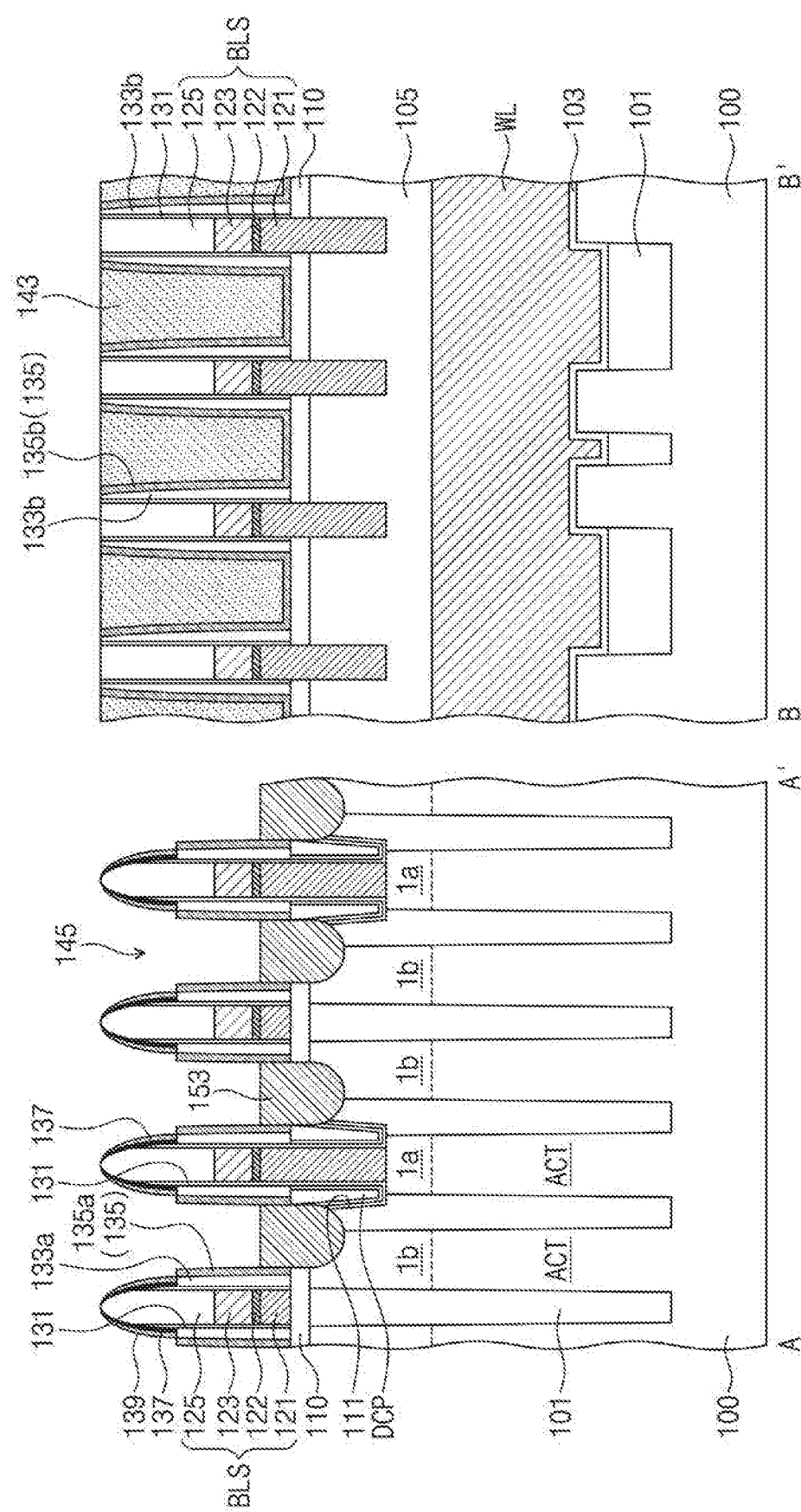
Figure 12C:
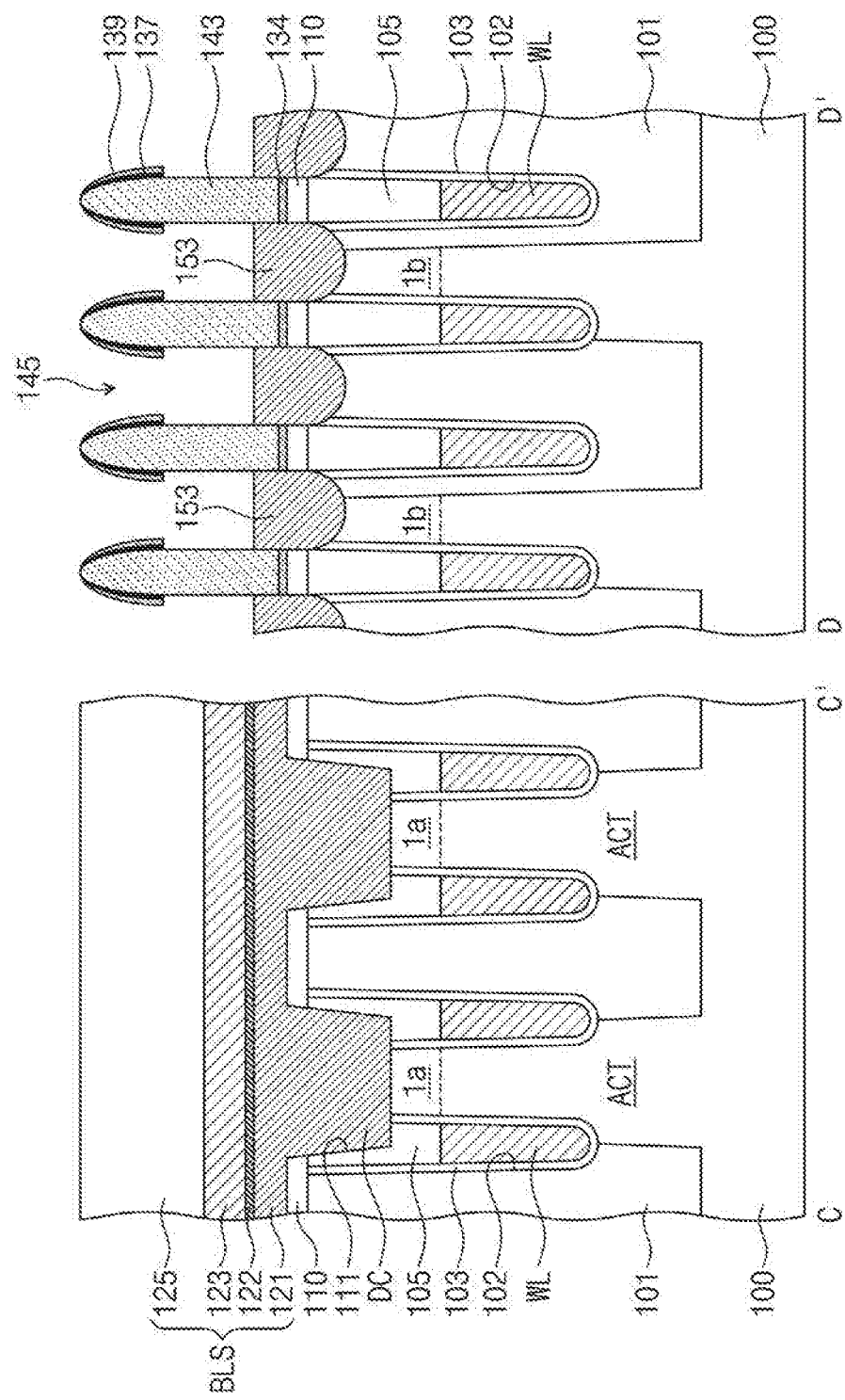

Referring to FIGS. 12A, 12B and 12C, a third spacer 139 may be formed on the second sacrificial spacer 137. The third spacer 139 may be formed by conformally forming a third spacer layer in the contact holes 145 in which the second sacrificial spacer 137 are formed and then etching back the third spacer layer. The third spacer 139 may be formed on the preliminary contact patterns 151 and the first portions 133a and 135a of the first sacrificial spacer 133 and the second spacer 135. The third spacer 139 may be formed of a material having an etch selectivity relative to the second sacrificial spacer 137 and may be thicker than the second sacrificial spacer 137.

After forming the third spacer 139, the top surfaces of the preliminary contact patterns 151 exposed by the third spacer 139 may be recessed to form contact conductive patterns 153. In an example, top surfaces of the contact conductive patterns 153 may be positioned lower than the top surfaces of the metal patterns 123 of the bit line structures BLS. Thus, portions of sidewalls of the first portions 135a of the second spacer 135 and portions of the sidewalls of the insulating patterns 143 may be exposed by the contact holes 145.

Figure 13A:
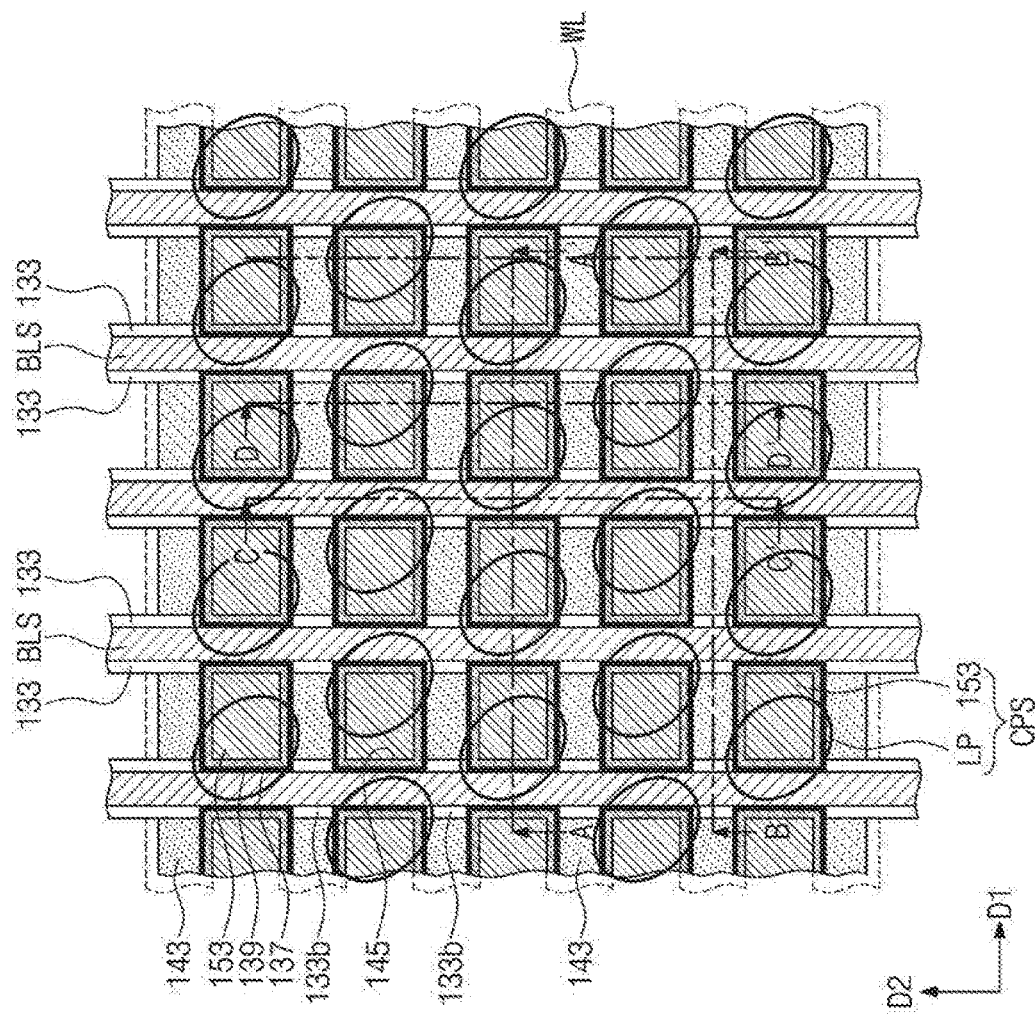
Figure 13B:
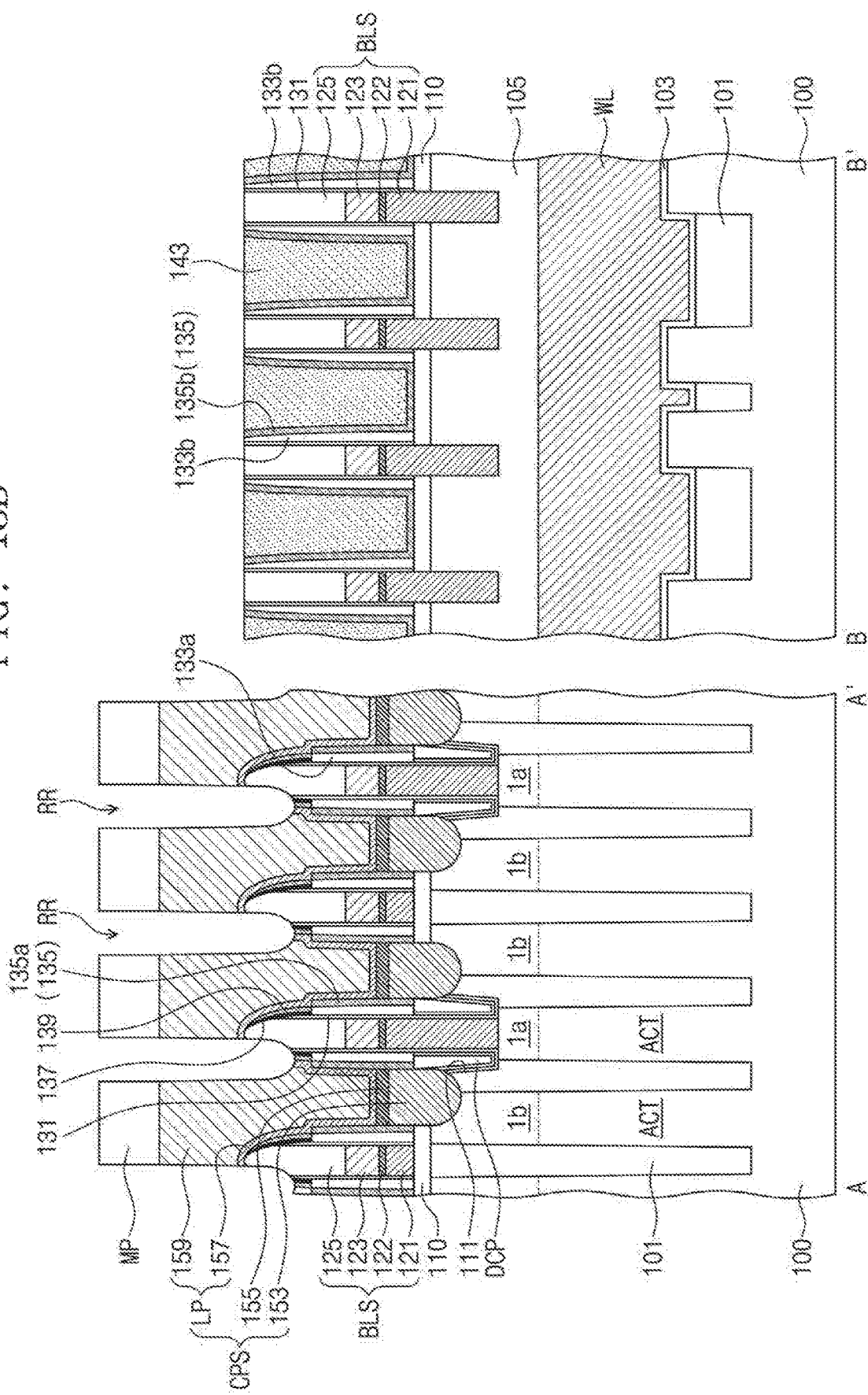
Figure 13C:
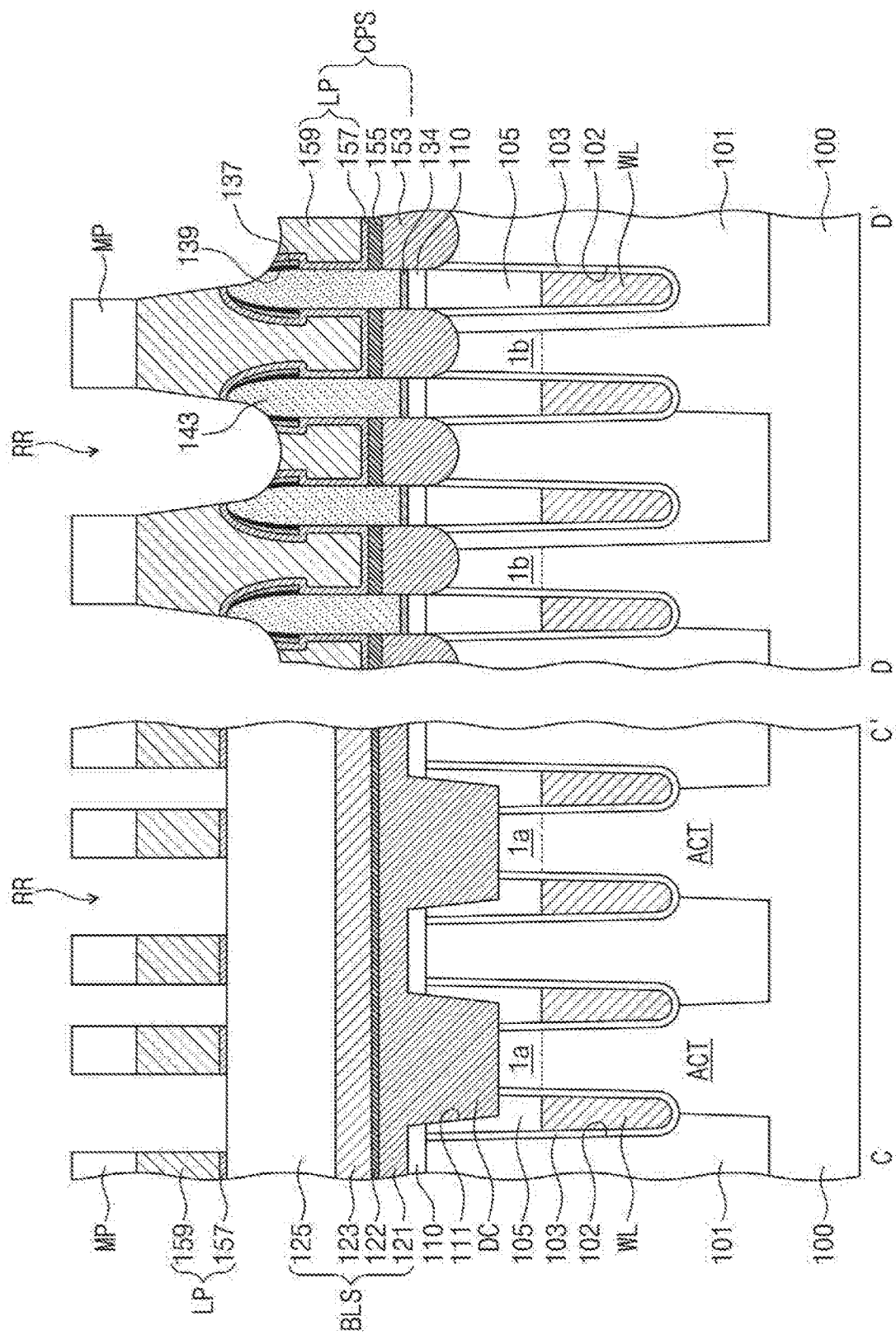

Referring to FIGS. 13A, 13B and 13C, contact silicide patterns 155 may be formed on the top surfaces of the contact conductive patterns 153 exposed by the second sacrificial spacer 137 and the third spacer 139. The contact silicide patterns 155 may be formed by reacting the top surfaces of the contact conductive patterns 153 with a metal material. The contact silicide patterns 155 may be formed of, for example, titanium silicide, cobalt silicide, nickel silicide, tungsten silicide, platinum silicide and/or molybdenum silicide. In some embodiments, the formation of the contact silicide patterns 155 may be omitted.

Subsequently, landing pads LP may be formed to fill the contact holes 145 in which the second sacrificial spacer 137 and the third spacer 139 are formed and to be connected to the contact conductive patterns 153, respectively.

The formation of the landing pads LP may include conformally depositing a barrier metal layer 157 on some portions of or the entire surface of the semiconductor substrate 100, forming a metal layer 159 on the barrier metal layer 157 to fill the contact holes 145, forming mask patterns MP on the metal layer 159, and forming a pad recess region RR by sequentially etching the metal layer 159 and the metal barrier layer 157 using the mask patterns MP as an etch mask. Here, the metal layer 159 may be fully fill the contact holes 145 and may partially or entirely extend on or cover the bit line structures BLS.

The pad recess region RR may separate the landing pads LP form each other and may have a bottom surface lower than the surfaces of the bit line structures BLS. Furthermore, while forming the pad recess region RR, a portion of the hard mask pattern 125, a portion of the second sacrificial spacer 137 and a portion of the third spacer 139 may be etched. Thus, a portion of the second sacrificial spacer 137 may be exposed by the pad recess region RR between the landing pads LP. The first portion 133a of the first sacrificial spacer 133 adjacent to the contact pad structures CPS may overlap with upper portions of the landing pads LP, and thus may not be exposed by the pad recess region RR.

The landing pads LP may each include a lower portion filling a lower portion of each of the contact holes 145 and an upper portion extending to the top surface of each of the bit line structures BLS. The upper portion of each of the landing pads LP may have an elliptical shape in plan view and may have a major axis oblique to both the first and second directions D1 and D2. Although a width of each of the landing pads LP in a direction of the major axis is increased while forming the landing pads LP, since the landing pads LP each have the major axis oblique to both the first and second directions D1 and D2, a process margin between the landing pads LP may be secured.

Figure 14A:
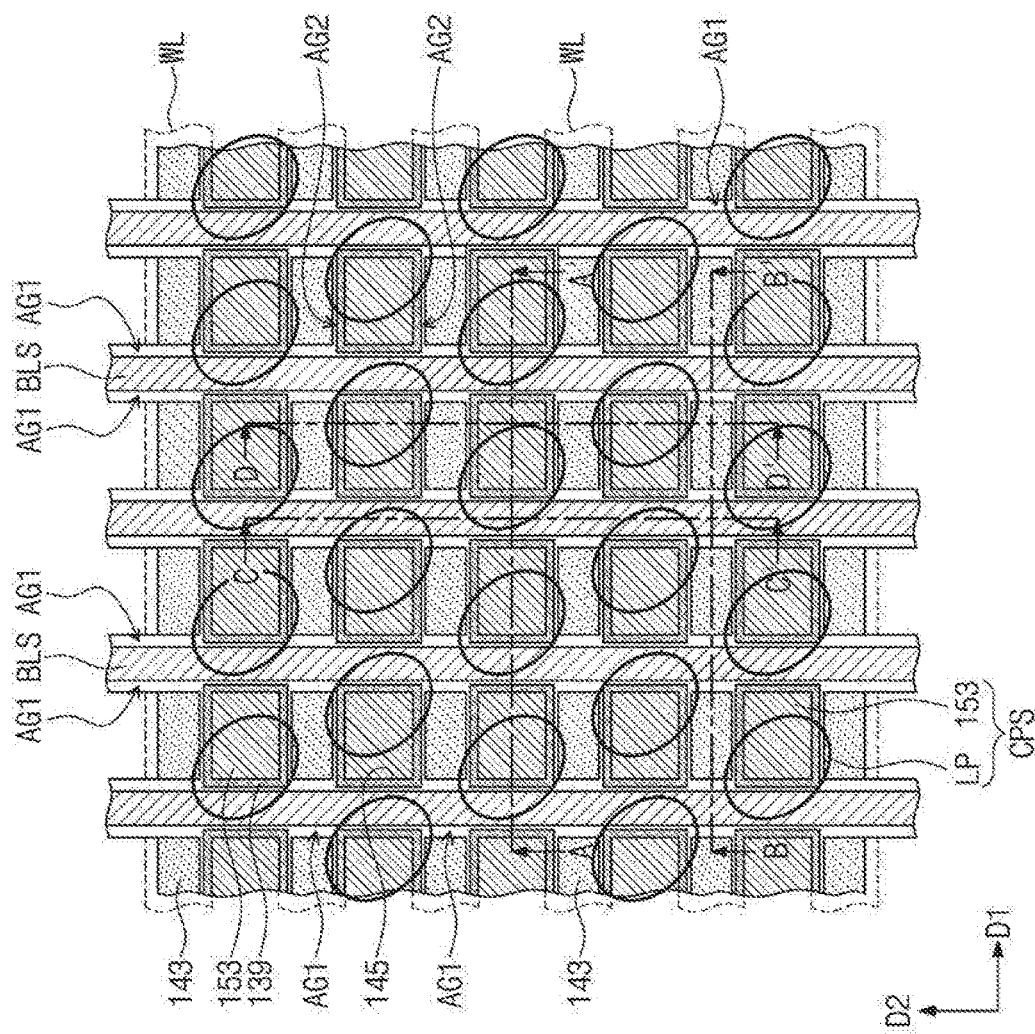
Figure 14B:
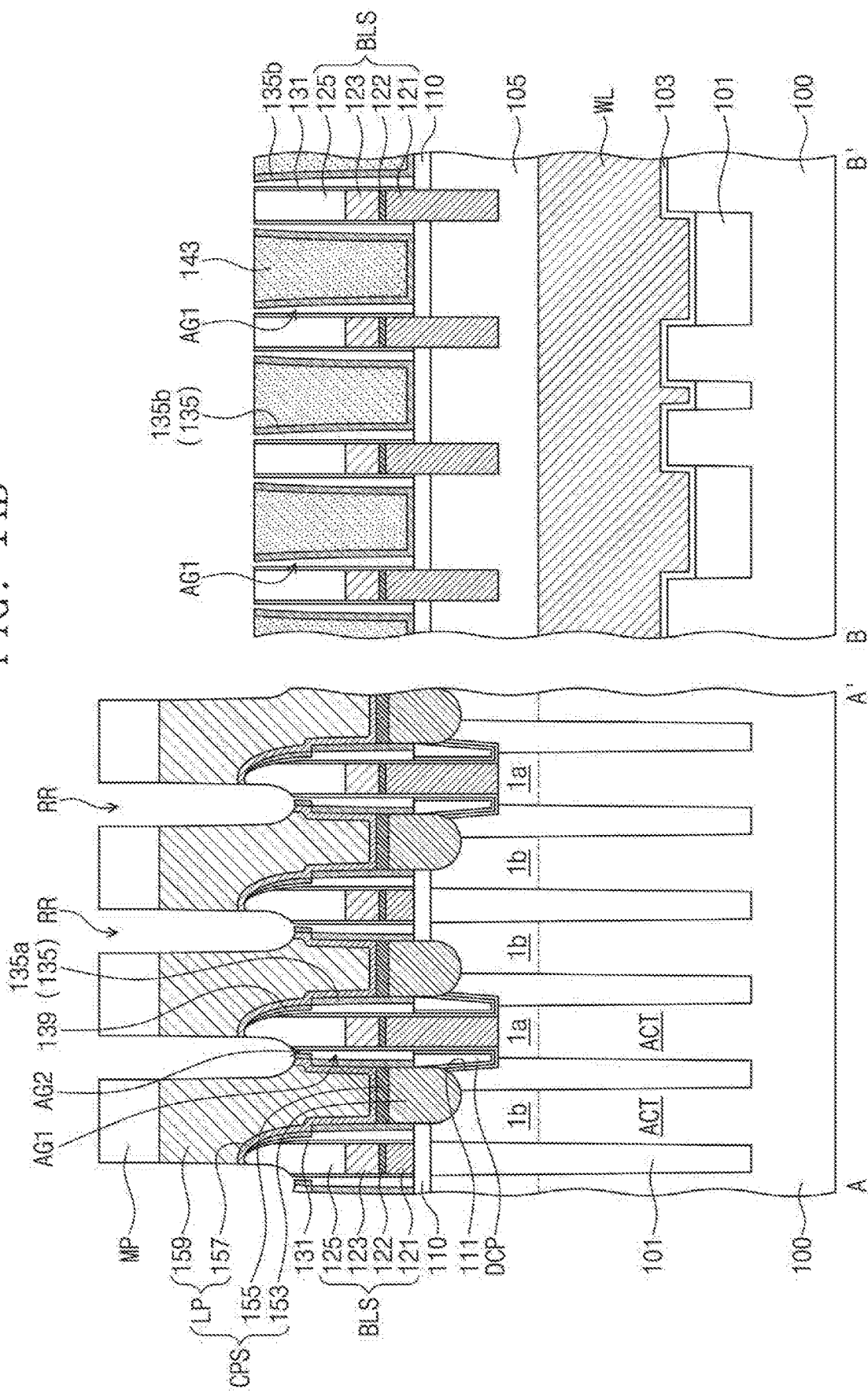
Figure 14C:
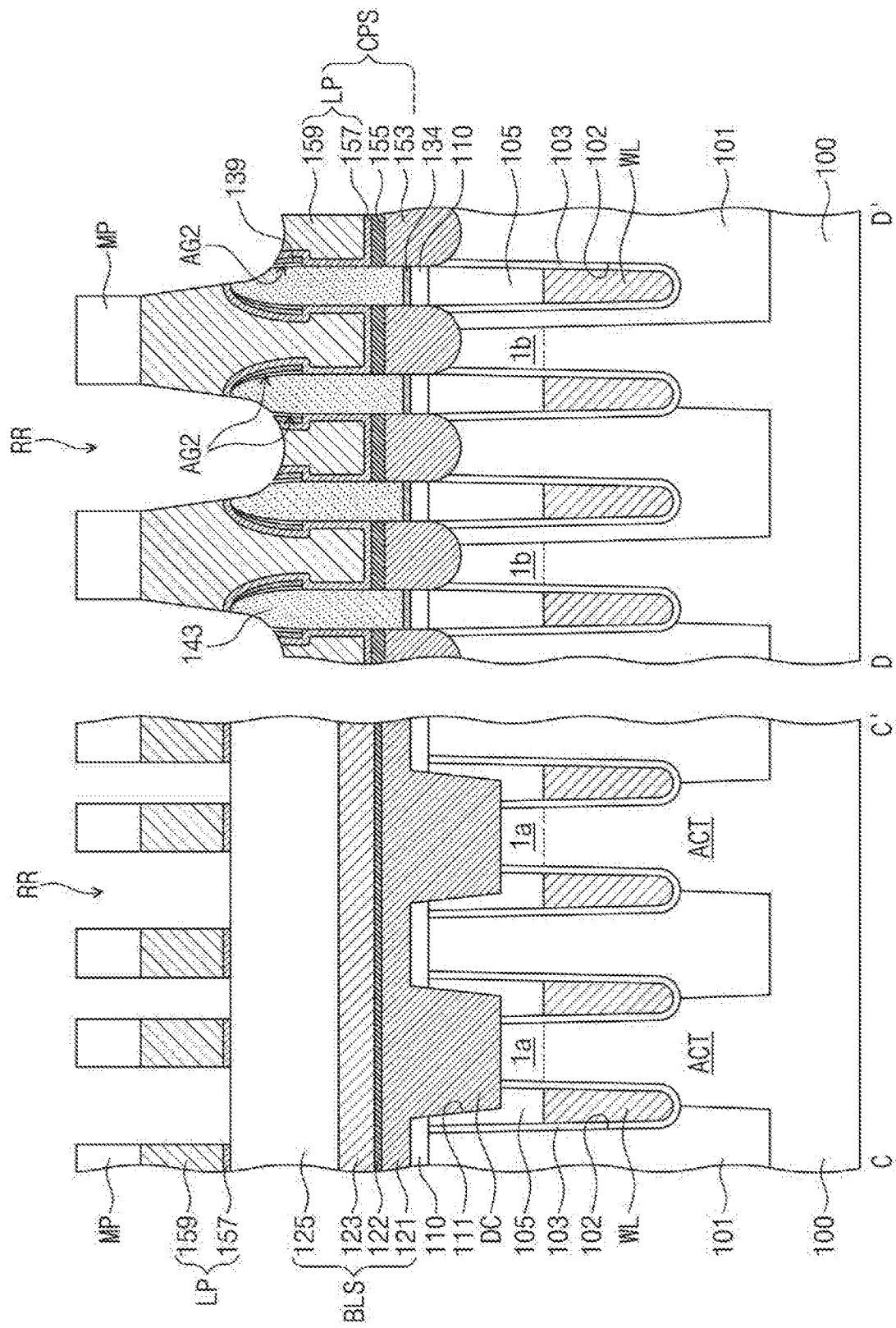

Referring to FIGS. 14A, 14B and 14C, after forming the pad recess regions RR, the first and second sacrificial spacers 133 and 137 may be removed to form a first air gap AG1 and a second air gap AG2. The first and second air gaps AG1 and AG2 may be formed by performing an isotropic etch process using an etch recipe with an etch selectivity relative to the first through third spacers 131, 135 and 139 and the insulating patterns 143.

As an example, the first and second air gaps AG1 and AG2 may be formed by etching the first and second sacrificial spacers 133 and 137 with an etchant provided through the pad recess region RR. For example, the etchant may be provided to a portion of the second sacrificial spacer 137 and the second portions 133b of the first sacrificial spacer 133 that are exposed by the pad recess region RR. Since the portion of the second sacrificial spacer 137 has a ring shape in plan view and directly contacts the first portions 133a of the first sacrificial spacer 133, although the first portions 133a of first sacrificial spacer 133 are exposed by the pad recess regions RR, an wet etchant may be provided to the first portions 133a of the first sacrificial spacer 133 through an empty space that is formed by removing the second sacrificial spacer 137. For example, portions of the first sacrificial spacer 133 (i.e., the first portions 133a adjacent to the contact pad structures CPS) may be removed through the empty space formed by removing the second sacrificial spacer 137 formed in the ring shape as well as through an empty space formed by removing the second portions 133b of the first sacrificial spacer 133.

As the first and second sacrificial spacers 133 and 137 are removed, the first air gap AG1 defined as a gap between the first and second spacers 13 1and 135 (i.e., an empty space formed by the removal of the first sacrificial spacer 133) and the second air gap AG2 may be defined as a gap between the first spacer 131 and the third spacer 139 and between the insulating patterns 143 and the third spacer 139 (i.e., an empty space formed by the removal of the second sacrificial spacer 137). Here, the first air gap AG1 and the second air gap AG2 may be coupled (or in fluid communication) together to form a single empty space. Furthermore, since the second sacrificial spacer 137 directly contacts, in the respective contact holes 145, the first sacrificial spacers 133 adjacent to each other in the first direction D1 and extending in the second direction D2, the second air gap AG2 may be coupled to two first air gaps AG1 extending in the second direction D2.

Next, after forming the first and second air gaps AG1 and AG2, as shown in FIGS. 1A, 1B and 1C, a first capping insulating layer 161 conformally covering an inner surface of the pad recess region RR and a second capping insulating layer 163 fully filling the pad recess region RR may be sequentially formed.

The first capping insulating layer 161 may be formed using a deposition process having poor step coverage, and thus may seal the second air gap AG2 while not filling the second air gap AG2.

According to example embodiments, the first sacrificial spacer extending along the sidewalls of the bit line structures and the second sacrificial spacer surrounding the lower portion of the landing pad and directly contacting the first sacrificial spacer may be formed. Thus, when forming the air gap between the bit line structures and the contact pad structures, the first sacrificial spacer covered by the landing pad may be easily removed. As a result, since the air gap is formed to extend along the sidewalls of the bit line structures and surround the lower portion of the landing pad, a parasitic capacitance between the bit line structures and the contact pad structures can be reduced. Therefore, reliability and electrical properties of the semiconductor memory device can be improved.

The above-disclosed subject matter is to be considered illustrative, and not restrictive, and the appended claims are intended to cover all such modifications, enhancements, and other embodiments, which fall within the true spirit and scope of the inventive concepts. Thus, to the maximum extent allowed by law, the scope is to be determined by the broadest permissible interpretation of the following claims and their equivalents, and shall not be restricted or limited by the foregoing detailed description.

What is claimed is:

1. A semiconductor memory device, comprising:
    word lines extending in a first direction in a semiconductor substrate;
    bit line structures crossing over the word lines and extending in a second direction intersecting the first direction;
    contact pad structures between the bit line structures and between the word lines, in plan view;
    insulating patterns on the word lines and, in plan view, between the contact pad structures and between the bit line structures; and
    a spacer structure between the bit line structures and the contact pad structures,
    wherein the spacer structure comprises:
        a first spacer and a second spacer continuously extending from a first region between the bit line structures and the contact pad structures to a second region between the bit line structures and the insulating patterns, in the second direction; and
        an air gap between the first spacer and the second spacer, wherein the air gap continuously extends from the first region to the second region and includes a lower region having a first width and an upper region having a second width that is smaller than the first width.

2. The device of claim 1, wherein a height of the lower region of the air gap is greater than a height of the upper region of the air gap.

3. The device of claim 1, wherein each of the bit line structures comprises:

a bit line conductive pattern including contact portions contacting the semiconductor substrate and a wire portion connected to the contact portions and extending along the second direction; and a hard mask pattern on the bit line conductive pattern, wherein the upper region of the air gap is adjacent to the hard mask pattern.

4. The device of claim 1, wherein the lower region of the air gap extends along the second direction, and wherein the upper region of the air gap extends from the lower region to between the insulating patterns and the contact pad structures along the first direction.

5. The device of claim 1, wherein each of the contact pad structures comprises:

a contact conductive pattern; and a landing pad connected to the contact conductive pattern and extending onto a portion of the spacer structure and a portion of a respective one of the bit line structures, wherein the landing pad comprises a lower portion between the bit line structures and between the insulating patterns, and an upper portion on the portion of the respective one of the bit line structures.

6. The device of claim 5, further comprising a pad insulating pattern between the landing pads of the contact pad structures, wherein a portion of the air gap overlaps with the landing pad, in plan view.

7. The device of claim 5, further comprising a pad insulating pattern between the landing pads of the contact pad structures, wherein a top surface of the second spacer that is adjacent to the contact pad structures is spaced apart from a bottom surface of the pad insulating pattern.

8. The device of claim 1, wherein the first spacer extends on a sidewall of the one of the bit line structures, and the second spacer extends on a sidewall of a respective one of the insulating patterns that is parallel to the sidewall of the one of the bit line structures.

9. A semiconductor memory device, comprising:

a first bit line structure and a second bit line structure extending in a first direction on a semiconductor substrate, the first bit line structure having a first sidewall and the second bit line structure having a second sidewall opposite to the first sidewall;

contact pad structures arranged to be spaced apart from each other in the first direction, between the first and second bit line structures;

a first spacer structure comprising a first air gap, the first air gap continuously extending along the first sidewall of the first bit line structure; and a second spacer structure comprising a second air gap, the second air gap continuously extending along the second sidewall of the second bit line structure, wherein the first and second spacer structures cover sidewalls of at least two of the contact pad structures spaced apart from each other in the first direction, and wherein each of the first and second air gaps includes a lower region having a first width and an upper region having a second width that is smaller than the first width.

10. The device of claim 9, wherein a height of the upper region of the first air gap is different from a height of the upper region of the second air gap.

11. The device of claim 9, wherein each of the first and second bit line structures comprises:

a bit line conductive pattern including contact portions contacting the semiconductor substrate and a wire portion connected to the contact portions and extending along the first direction; and a hard mask pattern on the bit line conductive pattern, wherein the upper region of the first air gap is adjacent to the hard mask pattern of the first bit line structure.

12. The device of claim 9, further comprising insulating patterns between adjacent contact pad structures in the first direction, wherein each of the first and second spacer structures extend from between each of the first and second bit line structures and the contact pad structures to between each of the first and second bit line structures and the insulating patterns.

13. The device of claim 12, further comprising third spacer structures including third air gaps surrounding the contact pad structures, respectively, in plan view, wherein the contact pad structures respectively comprise:

a contact conductive pattern contacting the semiconductor substrate; and a landing pad connected to the contact conductive pattern and extending on portions of the first, second, and third spacer structures and a portion of a respective one of the first and second bit line structures, wherein the landing pad includes a lower portion surrounded by the first and second bit line structures and the insulating patterns, and an upper portion on the portion of the respective one of the first and second bit line structures.

14. The device of claim 9, wherein the contact pad structures comprise respective conductive landing pads between the first and second sidewalls of the first and second bit line structures and on impurity regions of the semiconductor substrate, and respective contact pads between the respective conductive landing pads and the impurity regions, and further comprising:

third air gaps extending from at least one of the first and second air gaps and along multiple sides of the respective conductive landing pads, wherein the first and second air gaps extend along sidewalls of the respective contact pads, and the third air gaps are confined above the sidewalls of the respective contact pads.

15. The device of claim 14, further comprising:

insulating patterns between the first and second sidewalls of the first and second bit line structures and between the respective conductive landing pads, wherein the third air gaps extend from the at least one of the first and second air gaps along the multiple sides of the respective conductive landing pads to separate the respective conductive landing pads from the insulating patterns.

16. The device of claim 15, wherein the third air gaps extend along the multiple sides of the respective conductive landing pads to couple the first air gap to the second air gap.

17. The device of claim 14, wherein the first air gap is defined between a first spacer and a second spacer of the first spacer structure extending along the first sidewall of the first bit line structure, and wherein the third air gaps are defined between the first spacer and third spacers that extend from the second spacer towards top surfaces of the respective conductive landing pads.

18. A semiconductor memory device, comprising:

a first bit line structure and a second bit line structure extending in a first direction on a semiconductor substrate, the first bit line structure having a first sidewall and the second bit line structure having a second sidewall opposite to the first sidewall;

contact pad structures arranged to be spaced apart from each other in the first direction, between the first and second bit line structures;

a first spacer structure comprising a first air gap extending along the first sidewall of the first bit line structure; and a second spacer structure comprising a second air gap extending along the second sidewall of the second bit line structure, wherein each of the first and second air gaps includes a lower region having a first width and an upper region having a second width that is smaller than the first width, wherein the first spacer structure comprises a first spacer and a second spacer extending along the first sidewall of the first bit line structure, and the first air gap is defined between the first and second spacers, wherein the second spacer structure comprises a third spacer and a fourth spacer extending along the second sidewall of the second bit line structure, and the second air gap is defined between the third and fourth spacers, and wherein the second and fourth spacers respectively comprise first portions adjacent to the contact pad structures and second portions between the first portions in the first direction, and wherein a height of the first portions is smaller than a height of the second portions.

* * * * *